United States Patent
Shirasaki et al.

(10) Patent No.: US 7,317,429 B2
(45) Date of Patent: Jan. 8, 2008

(54) DISPLAY PANEL AND DISPLAY PANEL DRIVING METHOD

(75) Inventors: Tomoyuki Shirasaki, Higashiyamato (JP); Hiroyasu Yamada, Hachioji (JP); Reiji Hattori, Fukuoka (JP)

(73) Assignee: Casio Computer Co., Ltd., Tokyo (JP)

( * ) Notice: Subject to any disclaimer, the term of this patent is extended or adjusted under 35 U.S.C. 154(b) by 619 days.

(21) Appl. No.: 10/472,423

(22) PCT Filed: Dec. 12, 2002

(86) PCT No.: PCT/JP02/13034

§ 371 (c)(1),
(2), (4) Date: Sep. 16, 2003

(87) PCT Pub. No.: WO03/058328

PCT Pub. Date: Jul. 17, 2003

(65) Prior Publication Data

US 2004/0113873 A1 Jun. 17, 2004

(30) Foreign Application Priority Data

Dec. 28, 2001 (JP) .............................. 2001-400557

(51) Int. Cl.
*G09G 3/12* (2006.01)
(52) U.S. Cl. .......................................... 345/36; 345/39
(58) Field of Classification Search .................. 345/76, 345/77, 80, 81, 82, 84, 87, 36–42, 44, 45, 345/50–51, 589–605, 690; 315/169.1, 169.3; 348/800; 430/139
See application file for complete search history.

(56) References Cited

U.S. PATENT DOCUMENTS

| 5,680,149 A | 10/1997 | Koyama et al. |
| 6,023,259 A | 2/2000 | Howard et al. |

(Continued)

FOREIGN PATENT DOCUMENTS

| EP | 1 146 501 A1 | 10/2001 |
| EP | 1 170 718 A1 | 1/2002 |
| EP | 1 372 136 A1 | 12/2003 |
| EP | 1 443 483 A2 | 8/2004 |
| JP | 1-123292 A | 5/1989 |
| JP | 2506840 B2 | 4/1996 |

(Continued)

*Primary Examiner*—Nitin I. Patel
(74) *Attorney, Agent, or Firm*—Frishauf, Holtz, Goodman & Chick, P.C.

(57) ABSTRACT

A display panel includes an optical element which has a pair of electrodes and exhibits an optical operation corresponding to an electric current flowing between the electrodes, and a switch circuit which supplies a memory current having a predetermined current value to a current line during a selection period, and stops the supply of the memory current to the current line during a non-selection period. A current memory circuit stores current data corresponding to the current value of the memory current flowing through the current line during the selection period and, in accordance with the current data stored during the selection period, supplies a display current having a current value substantially equal to the memory current to the optical element during the non-selection period.

34 Claims, 11 Drawing Sheets

U.S. PATENT DOCUMENTS

| | | |
|---|---|---|
| 6,091,382 A | 7/2000 | Shioya et al. |
| 6,166,714 A | 12/2000 | Kishimoto |
| 6,229,506 B1 | 5/2001 | Dawson et al. |
| 6,373,454 B1 | 4/2002 | Knapp et al. |
| 6,522,315 B2 | 2/2003 | Ozawa et al. |
| 6,577,302 B2 | 6/2003 | Hunter et al. |
| 6,650,060 B2 | 11/2003 | Okuda |
| 6,661,180 B2 | 12/2003 | Koyama |
| 6,667,580 B2 | 12/2003 | Kim et al. |
| 6,734,636 B2 | 5/2004 | Sanford et al. |
| 6,744,414 B2 | 6/2004 | Lee et al. |
| 6,750,833 B2 | 6/2004 | Kasai |
| 6,788,003 B2 | 9/2004 | Inukai et al. |
| 6,859,193 B1 | 2/2005 | Yumoto |
| 6,900,784 B2 | 5/2005 | Tsuchida |
| 6,930,680 B2 | 8/2005 | Miyazawa |
| 6,943,759 B2 | 9/2005 | Tam |
| 6,947,019 B2 | 9/2005 | Sato et al. |
| 2001/0017618 A1 | 8/2001 | Azami |
| 2001/0035863 A1 | 11/2001 | Kimura |
| 2001/0052606 A1 | 12/2001 | Sempel et al. |
| 2002/0014852 A1 | 2/2002 | Bae |
| 2002/0075208 A1 | 6/2002 | Bae et al. |
| 2002/0135309 A1 | 9/2002 | Okuda |
| 2002/0163514 A1 | 11/2002 | Nagai et al. |
| 2002/0195968 A1 | 12/2002 | Sanford et al. |
| 2003/0020335 A1 | 1/2003 | Komiya |
| 2003/0098708 A1 | 5/2003 | Matsueda |
| 2003/0103022 A1* | 6/2003 | Noguchi et al. ............... 345/77 |
| 2003/0112205 A1* | 6/2003 | Yamada ....................... 345/32 |
| 2004/0036664 A1 | 2/2004 | Miyazawa |
| 2004/0165003 A1 | 8/2004 | Shirasaki |
| 2004/0183791 A1 | 9/2004 | Yoshida et al. |
| 2004/0236443 A1* | 11/2004 | Ware et al. ................... 700/90 |
| 2004/0246241 A1 | 12/2004 | Kazuhito et al. |
| 2004/0256617 A1 | 12/2004 | Yamada et al. |
| 2005/0140610 A1 | 6/2005 | Smith et al. |
| 2005/0157581 A1 | 7/2005 | Shiurasaki et al. |
| 2005/0219168 A1 | 10/2005 | Shirasaki et al. |
| 2006/0214890 A1 | 9/2006 | Morishige et al. |

FOREIGN PATENT DOCUMENTS

| | | |
|---|---|---|
| JP | 8-330600 A | 12/1996 |
| JP | 11-143429 A | 5/1999 |
| JP | 2000-221942 A | 8/2000 |
| JP | 2001-147659 A | 5/2001 |
| JP | 2002-215095 A | 7/2002 |
| JP | 2003-529805 A | 10/2003 |
| KR | 2000-0071301 A | 11/2000 |
| WO | WO 99/65011 A2 | 12/1999 |
| WO | WO 01/06484 A1 | 1/2001 |
| WO | WO 01/20591 A1 | 3/2001 |
| WO | WO 01/75852 A1 | 10/2001 |
| WO | WO 03/058328 A1 | 7/2003 |
| WO | WO 2004/001714 A1 | 12/2003 |

* cited by examiner

DISPLAY PANEL AND DISPLAY PANEL DRIVING METHOD

This application is a U.S. National Phase Application under 35 USC 371 of International Application PCT/JP02/13034 filed Dec. 12, 2002.

TECHNICAL FIELD

The present invention relates to a display panel having an active driving type optical element and a method of driving the same, and to a driving circuit and the like of, e.g., a light emitting element as the optical element.

BACKGROUND ART

A light emitting element display is conventionally known in which light emitting elements such as organic EL (electroluminescent) elements, inorganic EL elements, or light emitting diodes are arrayed in a matrix manner as optical elements, and the respective light emitting elements emit light to display an image. In particular, an active matrix driving type light emitting element display has advantages such as high luminance, high contrast, high resolution, and low power consumption. Therefore, such displays are developed in recent years, and particularly an organic EL element has attracted attention.

In some displays of this type, organic EL light emitting elements and a thin film transistor for driving this light emitting element by switching are combined in one pixel. A plurality of selection scan lines parallel to each other are formed on a transparent substrate. A plurality of signal lines perpendicular to these selection scan lines are also formed on the substrate. More specifically, two thin film transistors made of amorphous silicon (to be referred to as a-Si hereinafter) are formed in a region surrounded by the selection scan lines and signal lines, and one light emitting element is also formed in this region. That is, two transistors are formed in one pixel. The emission luminance (cd/m$^2$) of an organic EL element is determined by the value per unit area of an electric current flowing through the element.

FIG. 11 shows an equivalent circuit diagram of one pixel in a conventional light emitting element display. As shown in FIG. 11, two transistors 103 and 104 are connected to a selection scan line 101 and signal line 102 per pixel. One and the other of the source and drain electrodes of the transistor 104 are connected to an emission voltage line 106 having a positive constant voltage and to an anode of a light emitting element 105, respectively.

In this structure, when the selection scan line 101 is selected (when the transistor 103 which is an N-channel transistor is turned on by applying a high-level voltage to the selection scan line 101), a signal voltage is applied from the signal line 102 to the gate electrode of the transistor 104 via the transistor 103. Accordingly, the transistor 104 is turned on, an electric current flows from the emission voltage line 106 to the light emitting element 105 via the transistor 104, and thus the light emitting element 105 emits light. When the selection scan line 101 is unselected, the transistor 103 is turned off, and the voltage of the gate electrode of the transistor 104 is held. An electric current flows from the light emission voltage line 106 to the light emitting element 105 via the transistor 104, and the light emitting element 105 emits light.

In the above structure, the magnitude of an electric current flowing between the drain and source of the transistor 104 is adjusted by adjusting the magnitude of the gate-source voltage of the transistor 104, i.e., the voltage of the signal line 102. That is, the magnitude of the drain-source current of the transistor 104 is adjusted by using an unsaturated gate voltage as the voltage applied to the gate of the transistor 104, thereby adjusting the magnitude of the electric current flowing in the transistor 104 and light emitting element 105. Consequently, the luminance of the light emitting element 105 is adjusted, and tone display is performed. Between selection and non-selection after that, i.e., during one frame period, the gate-source voltage of the transistor 104 is substantially held constant, so the luminance of the light emitting element 105 is also held constant. This driving method is called a voltage driving method by which the luminance tone is controlled by modulation of the output signal voltage from the signal line 102 to the transistor 103.

The channel resistances of the transistors 103 and 104 depend upon the ambient temperature and change after a long-term operation. Therefore, it is difficult to display images with a desired luminance tone for long time periods. Also, if the channel layers of the transistors 103 and 104 are made of polysilicon, the channel resistances depend upon the numbers of grain boundaries as the interfaces between adjacent crystal grains in these channel layers. This may vary the numbers of crystal grains in the channel layers of a plurality of transistors 103 and a plurality of transistors 104 formed in a single panel. Especially when the grain size is increased to obtain high mobility, the number of grain boundaries in the channel layer inevitably decreases, so even a slight difference between the numbers of grain boundaries in the channel length direction has a large effect on the channel resistance. This varies the magnitudes of the drain-source currents of the transistors 104 in the individual pixels, resulting in variations in the display characteristics of the individual pixels in a single panel. As a consequence, no accurate tone control can be performed. Accordingly, variations in the characteristics of the transistor 104 of each pixel must fall within a range required to control the tone of each pixel. However, as the resolution of an EL element increases, it becomes more difficult to make the characteristics of the transistors 104 of the individual pixels uniform.

As described above, in some active matrix driving EL elements, a plurality of transistors are combined as active elements formed in each pixel. In some cases, a p-channel transistor and n-channel transistor are combined. When the characteristics of carriers are taken into consideration, a polysilicon transistor functions as a p-type transistor. When an amorphous silicon transistor is used, however, good physical properties with which the transistor functions well cannot be obtained. This makes it impossible to apply amorphous silicon transistors which can be fabricated at a relatively low cost.

Some of the active matrix EL display devices as described above are not voltage driven. In some of these display devices, an active element is made up of four or more transistors in one pixel. If these transistors are formed on a substrate, the upper surface is made uneven by the thicknesses of these transistors. Therefore, an organic EL layer is desirably formed on a flat portion other than the transistor formation region. In this case, no light is emitted in this transistor formation region, so a non-light-emitting portion is inevitably formed in the pixel. When one pixel emits light with a predetermined tone luminance, the brightness can be roughly set by (emission luminance per unit area)×(emission area of one pixel)×(emission time). However, when a large number of transistors are formed, the emission area of one pixel decreases. To compensate for this small emission area, the emission luminance per unit area must be increased.

Unfortunately, this shortens the light emission life because the organic EL layer is applied with a higher voltage and current. In addition, when the number of transistors in one pixel increases, the fabrication yield lowers exponentially.

Also, if too many transistors are connected in series with an EL element in a pixel, the voltage dividing ratio of these transistors rises. As a consequence, the power consumption is high.

Accordingly, one advantage of the present invention is that pixels stably display images with desired luminance in a display panel.

Another advantage of the present invention is that the display area per pixel of a display panel is increased.

DISCLOSURE OF INVENTION

To achieve the above advantages, a display panel according to one aspect of the present invention comprises:

one or more optical elements which have a pair of electrodes and exhibit an optical operation corresponding to an electric current flowing between the pair of electrodes;

one or more current lines;

one or more switch circuits which supply a memory current having a predetermined current value to the current line during a selection period, and stop supply of a current to the current line during a non-selection period; and one or more current memory circuits which store current data corresponding to the current value of the memory current flowing through the current line during the selection period and, in accordance with the current data stored during the selection period, supply a display current having a current value substantially equal to the memory current to the optical element during the non-selection period.

In the display panel having the above arrangement, the current memory circuit stores the current data corresponding to the current value of the memory current flowing during the selection period. Accordingly, the display current having a current value substantially equal to the memory current can be supplied to the optical element. Current control is thus performed by the current values, not by voltage values. This suppresses the influence of variations in the voltage-current characteristic of the control system and allows the optical element to stably display images with desired luminance.

In each pixel, the current memory circuit has only one current control transistor connected in series with the optical element. With this arrangement, the voltage between the optical element and current memory circuit is divided only by the optical element and current control transistor. This achieves a low voltage and consequently low power consumption driving.

Furthermore, each pixel can operate by using the three transistors, i.e., the current control transistor, current data write control transistor, and current path control transistor. This decreases the number of transistors in one pixel and increases the area occupied by the optical element. Decreasing the number of transistors in one pixel also decreases a reduction in the fabrication yield. Additionally, when an EL element is used as the optical element, the ratio of the light emission area in the pixel can be increased, and the apparent brightness improves accordingly. Therefore, the value of an electric current flowing per unit area can be decreased to a relatively small value. This suppresses deterioration of the EL element caused by an injection current.

Even when a transistor is formed in the current memory circuit as described above, changes in the voltage characteristic caused by deterioration of this transistor have no large influence since the transistor is driven by current control. Consequently, a display current having an accurate current value can be supplied.

A display panel driving method according to another aspect of the present invention comprises:

a current storage step of supplying a memory current having a predetermined current value to a current memory circuit and storing current data corresponding to the current value during a selection period; and a display step of supplying, to an optical element during a non-selection period, a display current having a current value substantially equal to the memory current in accordance with the current data stored in the current storage step.

In the present invention as described above, unlike in conventional devices, no preset voltage value is written in a transistor, so no electric current having a current value corresponding to the voltage value is supplied to an optical element. As a consequence, a display current having an accurate current value can be supplied.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF DRAWINGS

The accompanying drawings, which are incorporated in and constitute a part of the specification, illustrate embodiments of the invention, and together with the general description given above and the detailed description of the embodiments given below, serve to explain the principles of the invention.

BEST MODE FOR CARRYING OUT OF THE INVENTION

Practical embodiments of the present invention will be described below with reference to the accompanying drawings. However, the scope of the invention is not limited to the illustrated embodiments.

First Embodiment

Figure 1:
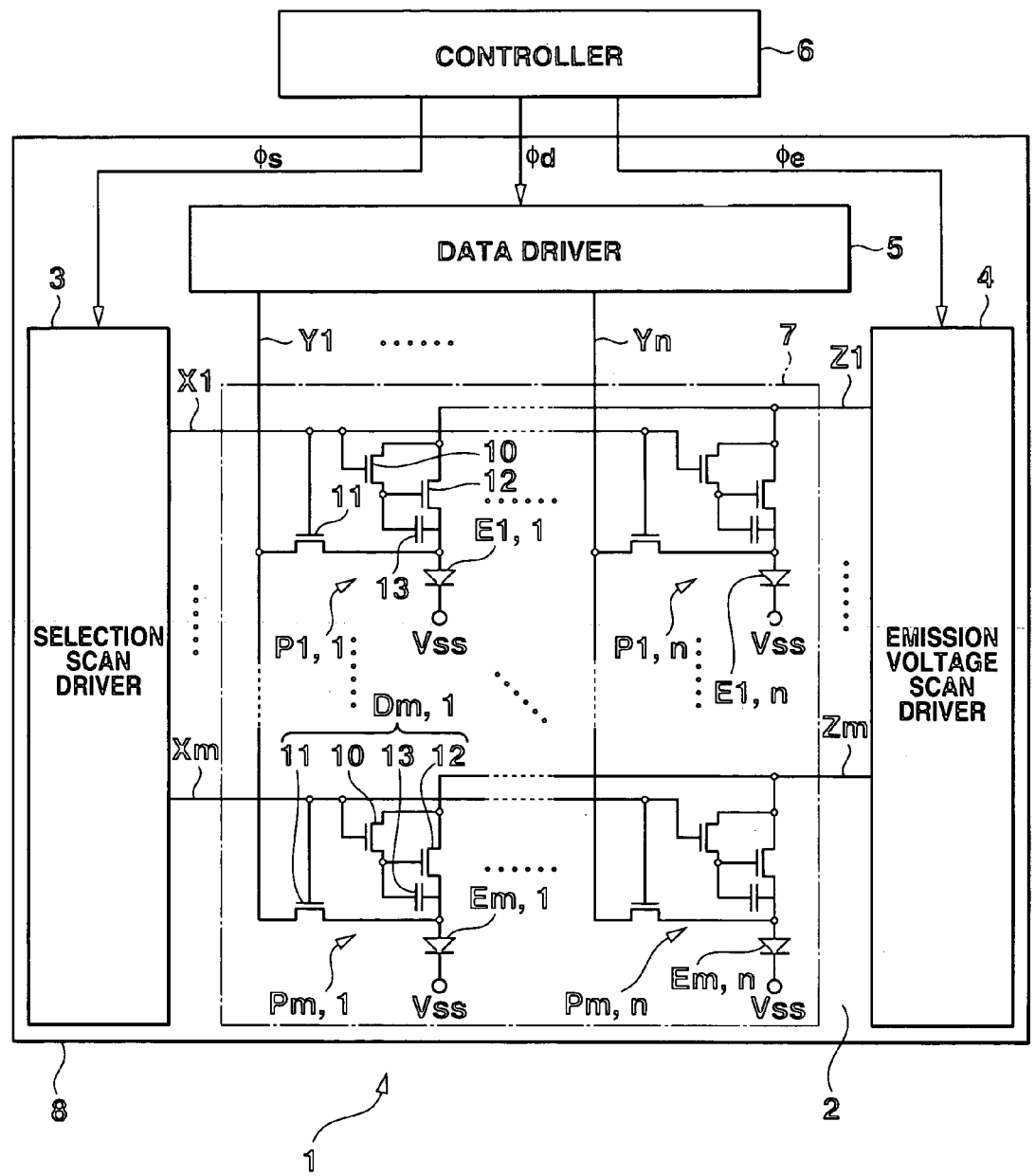
FIG. 1 is block diagram showing a practical arrangement of a light emitting element display to which the present invention is applied.

FIG. 1 is a block diagram showing a practical arrangement of a light emitting element display to which the present invention is applied. As shown in FIG. 1, the light emitting element display 1 includes, as its basic configuration, an active matrix type light emitting panel (driver) 2 and a controller 6 for controlling the whole light emitting display 1. The light emitting element display 1 is a so-called active matrix driving type display device. The light emitting panel 2 includes a transparent substrate 30 (shown in FIG. 3) which is made of, e.g., borosilicate glass, silica glass, and another glass which is resistant against temperatures during a transistor fabrication process (to be described later). Light emitting unit 7 is formed on the transparent substrate 30, has a plurality of pixels and emits light so as to display an image corresponding to image data from the controller 6. A selection scan driver 3, emission voltage scan driver 4, and data driver 5 are formed on the transparent substrate 30 and drive the individual pixels of the light emitting unit 7. These selection scan driver 3, emission voltage scan driver 4, and data driver 5 are so connected as to be able to receive control signals $\phi s$, $\phi e$, and $\phi d$, respectively, and data from the controller 6. Various lines and elements are formed on the transparent substrate 30 to construct the light emitting panel 2.

In this light emitting panel 2, m selection scan lines $X_1$, $X_2$, ..., $X_m$ are formed parallel to each other on the transparent substrate 30. In addition, m emission voltage scan lines $Z_1$, $Z_2$, ..., $Z_m$ are formed on the transparent substrate 30 so as to alternate with the selection scan lines $X_1$, $X_2$, ..., $X_m$, respectively. These emission voltage scan lines $Z_1$, $Z_2$, ..., $Z_m$ are parallel to and separated from the selection scan lines $X_1$, $X_2$, ..., $X_m$. Furthermore, current lines $Y_1$, $Y_2$, ..., $Y_n$ are formed on the transparent substrate 30 substantially perpendicularly to the selection scan lines $X_1$, $X_2$, ..., $X_m$ and emission voltage scan lines $Z_1$, $Z_2$, ..., $Z_m$. The selection scan lines $X_1$, $X_2$, ..., $X_m$, emission voltage scan lines $Z_1$, $Z_2$, ..., $Z_m$, and current lines $Y_1$, $Y_2$, ..., $Y_n$ are made of chromium, chromium alloy, aluminum, aluminum alloy, titanium, titanium alloy, or a low-resistance material selected from at least one of these materials. The selection scan lines $X_1$, $X_2$, ..., $X_m$ and emission voltage scan lines $Z_1$, $Z_2$, ..., $Z_m$ can be formed by patterning the same conductive film. The current lines $Y_1$, $Y_2$, ..., $Y_n$ are formed to cross the selection scan lines $X_1$, $X_2$, ..., $X_m$ and emission voltage scan lines $Z_1$, $Z_2$, ..., $Z_m$. The selection scan lines $X_1$, $X_2$, ..., $X_m$ and emission voltage scan lines $Z_1$, $Z_2$, ..., $Z_m$ are insulated from the current lines $Y_1$, $Y_2$, ..., $Y_n$ by, e.g., a gate insulating film 32 or semiconductor layer 33 (to be described later).

A plurality of organic EL elements ij are arrayed in a matrix manner on the transparent substrate 30. One organic EL element is formed in each of the regions surrounded by the current lines $Y_1$, $Y_2$, ..., $Y_n$ and selection scan lines $X_1$, $X_2$, ..., $X_m$. A driving circuit for supplying a predetermined electric current to each organic EL element is formed around each organic EL element. One organic EL element and the driving circuit corresponding to this element form one pixel Pij of the light emitting unit 2. That is, one organic EL element is formed for each of (m 33 n) pixels.

Figure 2:
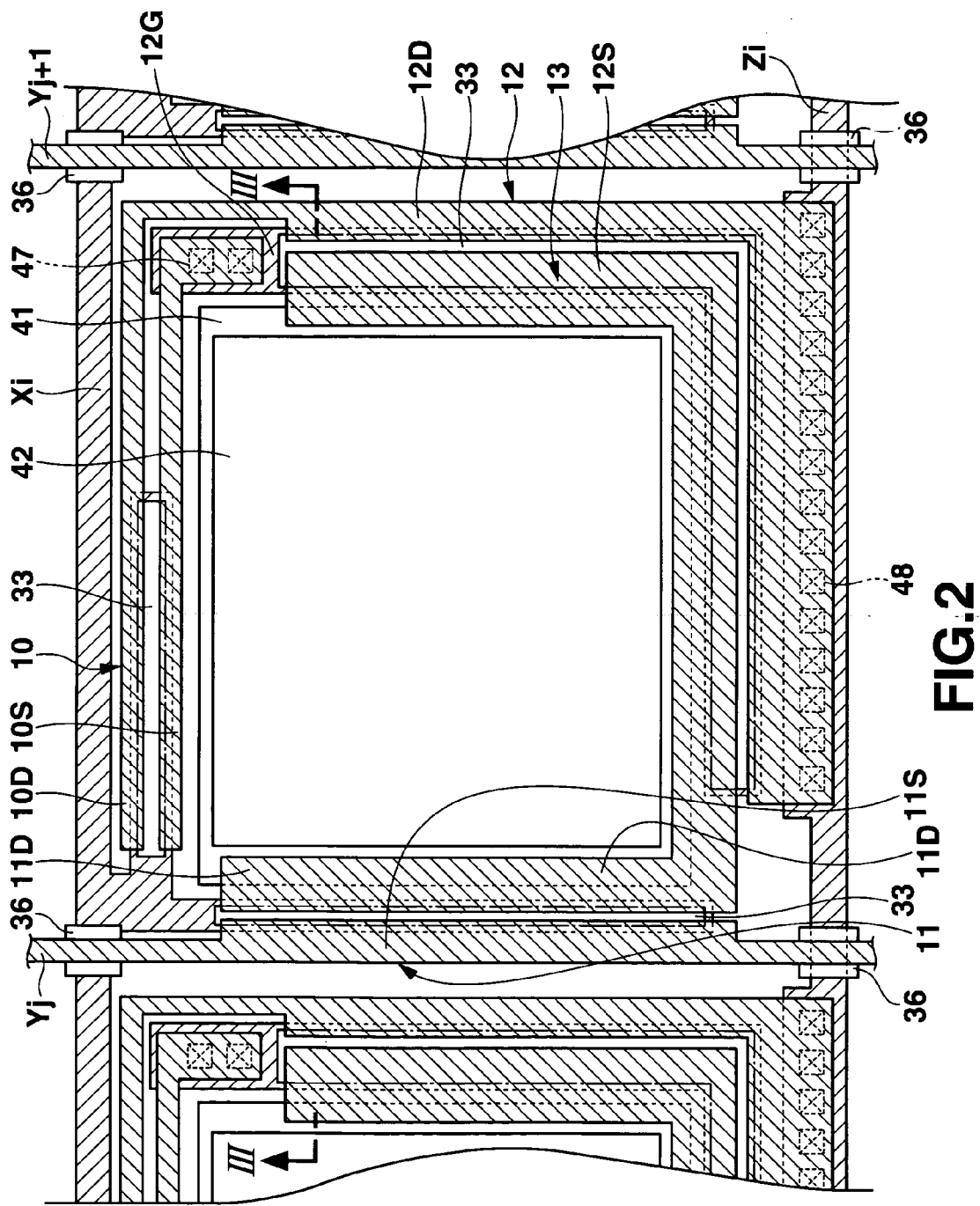
FIG. 2 is a plan view schematically showing one pixel of the light emitting element display.
Figure 3:
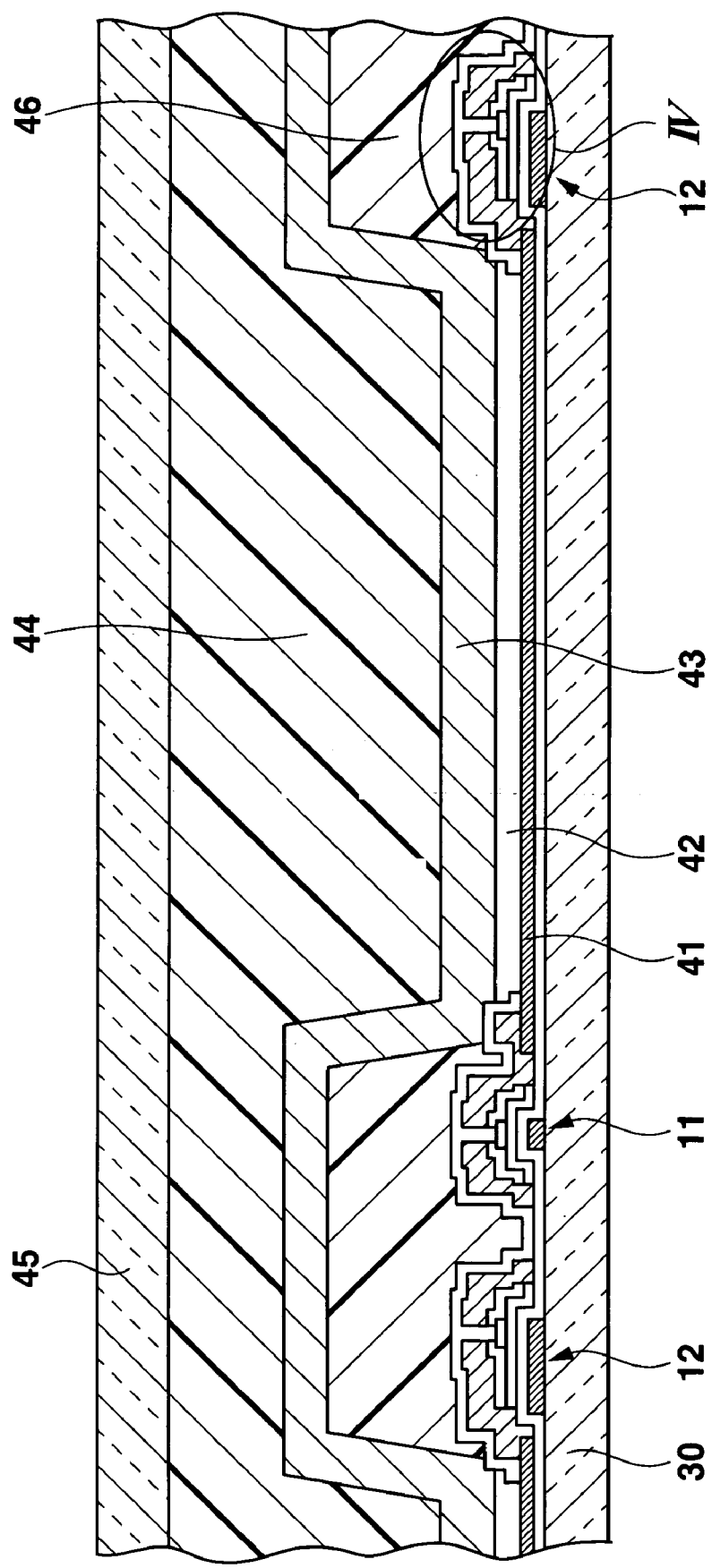
FIG. 3 is a sectional view showing a section taken along a line III-III in FIG. 2.
Figure 4:
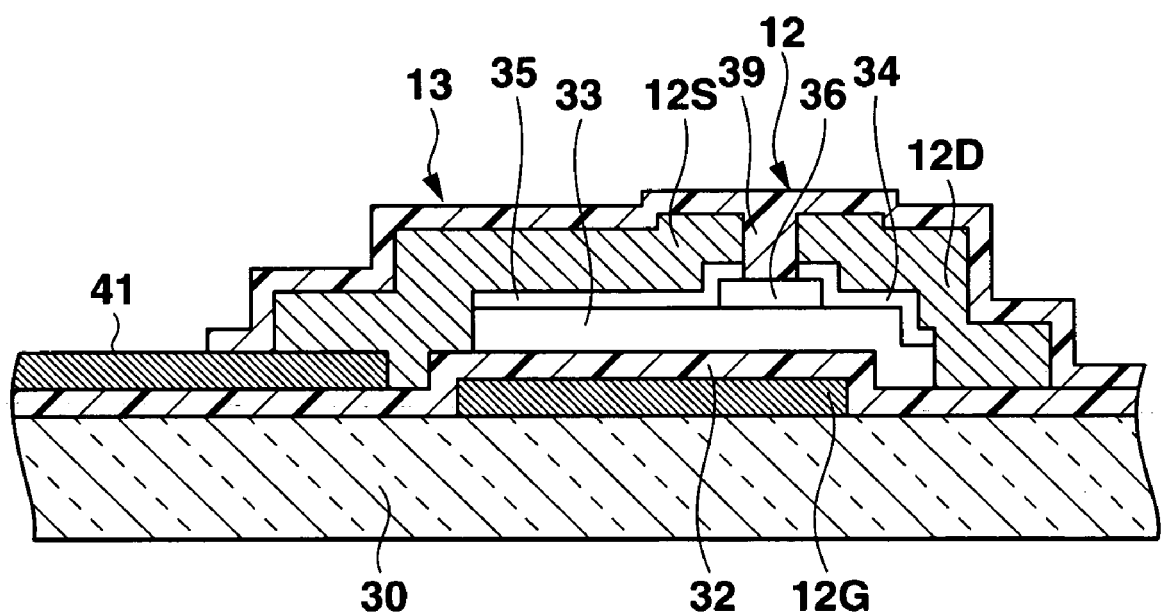
FIG. 4 is a sectional view showing a transistor surrounded by a line IV in FIG. 3.
Figure 5A:
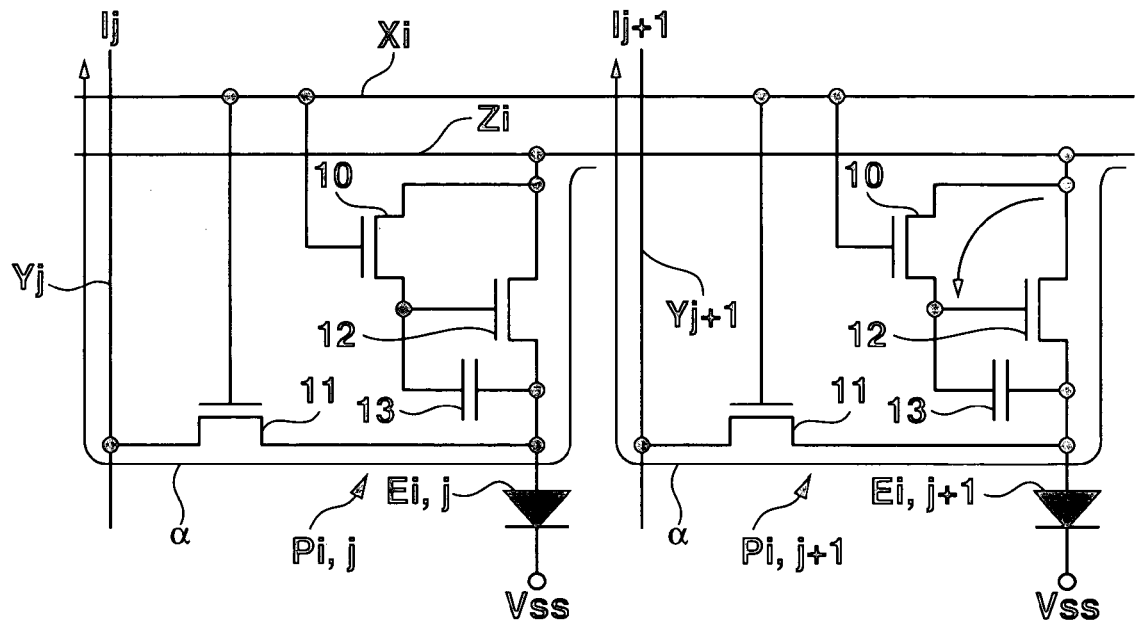
FIG. 5A is an equivalent circuit diagram of the pixel of the light emitting element display, showing the driving principle in a selection period.
Figure 5B:
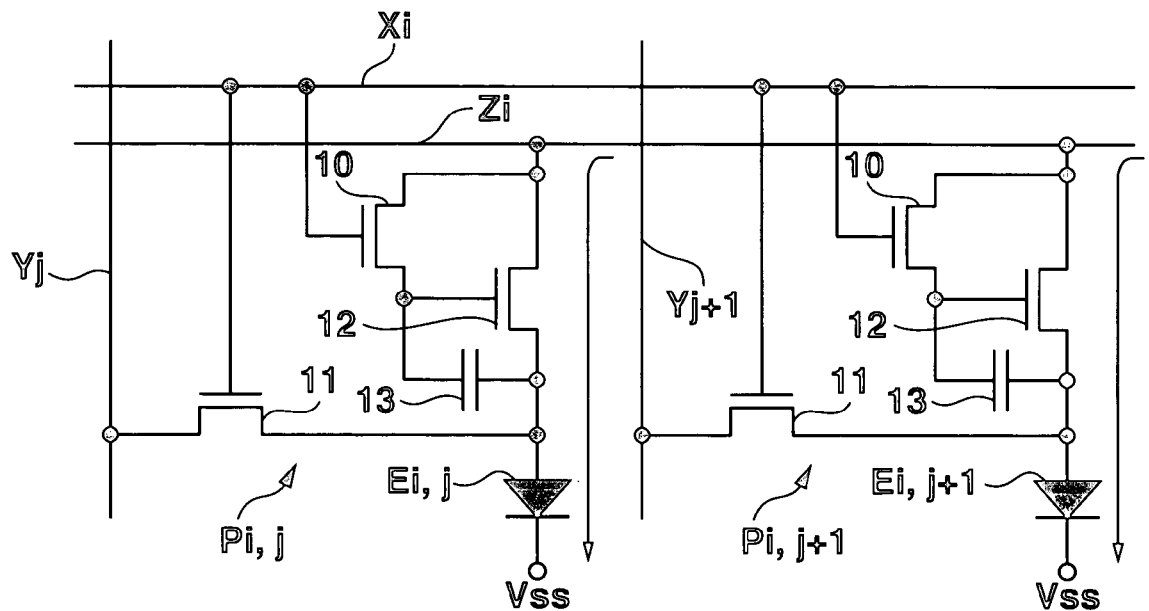
FIG. 5B is an equivalent circuit diagram of the pixel of the light emitting element display, showing the driving principle in a non-selection period.

Details of the light emitting unit 2 will be explained below. FIG. 2 is a plan view showing the major components of one pixel of this light emitting unit 2. FIG. 3 is a sectional view taken along line III in FIG. 2. FIG. 4 is a sectional view showing a region surrounded by a line IV in FIG. 3 in an enlarged scale. FIGS. 5A and 5B are equivalent circuit diagrams showing driving of two adjacent pixels $P_{i,j}$ and $P_{i,j+1}$. For better understanding of FIG. 2, a gate insulating film 32, first impurity doped layer 34, second impurity doped layer 35, block insulating film 36, cathode electrode 43, and the like are at least partially omitted. In FIG. 3, hatching is partially omitted to make the drawing readily understandable.

The organic EL element $E_{i,j}$ is formed in a region surrounded by the selection scan line $X_i$, current line $Y_j$, selection scan line $X_{i+1}$ (i.e., a selection scan line positioned in the lower stage of the selection scan line $X_i$, and positioned below the emission voltage scan line $Z_i$; not shown), and current line $Y_{j+1}$ (i.e., a signal line to the right of the current line $Y_j$; not shown). Around this organic EL element $E_{i,j}$, a capacitor 13 and three transistors 10, 11, and 12 as n-channel amorphous silicon thin film transistors are formed. A pixel driving circuit $D_{i,j}$ for driving the organic EL element $E_{i,j}$ includes the transistors 10, 11, and 12, capacitor 13, and the like. Here, i is an integer from 1 to m, and j is an integer from 1 to n. That is, the "selection scan line $X_i$" means a selection scan line in the ith row, the "emission voltage scan line $Z_i$" means an emission voltage scan line in the ith row, and the "current line $Y_j$" means a signal line in the jth column. The "pixel driving circuit $D_{i,j}$" means a driving circuit of a pixel $P_{i,j}$ in the ith row and jth column, and the "organic EL element $E_{i,j}$" means an organic EL element of this pixel $P_{i,j}$ in the ith row and jth column. G, S, and D attached to reference numerals 10, 11, and 12 mean the gate, source, and drain, respectively, of a transistor.

As shown in FIG. 4, the transistor 12 has a gate electrode (control terminal) 12G, a gate insulating film 32 formed on the entire surface of the light emitting unit 7, a semiconductor layer 33 for forming a single channel as a current path, a first impurity doped layer 34, a second impurity doped layer 35, a block insulating film 36, a drain electrode 12D, a source electrode 12S, and a protective insulating film 39. The gate electrode 12G is formed on the transparent substrate 30. The gate electrode 12G is made of chromium, chromium alloy, aluminum, aluminum alloy, titanium, titanium alloy, or a low-resistance material selected from at least one of these materials.

The gate insulating film 32 is formed on the gate electrode 12G and transparent substrate 30 so as to cover these gate electrode 12G and transparent substrate 30. The gate insulating film 32 is made of, e.g., silicon nitride or silicon oxide which transmits light and has insulating properties. The gate insulating film 32 also covers the gate electrodes of other transistors (all transistors formed on the transparent substrate 30), the selection scan lines $X_1, X_2, \ldots, X_m$, and the emission voltage scan lines $Z_1, Z_2, \ldots, Z_m$.

The semiconductor layer 33 opposes the gate electrode 12G via the part of the gate insulating film 32 (i.e., the semiconductor layer 33 is formed immediately above the gate electrode 12G). This semiconductor layer 33 is made of intrinsic amorphous silicon. On this semiconductor layer 33, the block insulating film 36 made of silicon nitride is formed. The first and second impurity doped layers 34 and 35 are formed to be separated from each other on one and the other side portions of the block insulating film 36. The first impurity doped layer 34 covers one side portion of the semiconductor layer 33 and one side portion of the block insulating film 36. The second impurity doped layer 35 covers the other side portion of the semiconductor layer 33 and the other side portion of the block insulating film 36. These first and second doped layers 34 and 35 are made of amorphous silicon doped with n-type impurity ions.

The drain electrode 12D is formed on the first impurity doped layer 34, and the source electrode 12S is formed on the second impurity doped layer 35. These drain electrode 12D and source electrode 12S are made of chromium, chromium alloy, aluminum, aluminum alloy, titanium, titanium alloy, or a low-resistance material selected from at least one of these materials, and have a function of blocking the transmission of visible light. This prevents the incidence of light from the outside or from the organic EL element $E_{i,j}$ onto the semiconductor layer 33 and first and second impurity doped layers 34 and 35.

The source electrode 12S and drain electrode 12D are electrically insulated from each other. The source electrode 12S is electrically connected to an anode electrode 41 (to be described later) of the EL element. The protective insulating film 39 covers the transistors 10, 11, and 12, capacitor 13, selection scan lines $X_1, X_2, \ldots, X_m$, current lines $Y_1, Y_2, \ldots, Y_n$, and emission voltage scan lines $Z_1, Z_2, \ldots, Z_m$, and exposes the anode electrode 41. That is, the protective insulating film 39 is so formed as to cover the surroundings of the anode electrode 41 in a matrix manner.

The transistor 12 constructed as above is an MOS field-effect transistor having the semiconductor layer 33 as a channel region. Since the transistors 10 and 11 have substantially the same structure as the transistor 12, a detailed description thereof will be omitted. One electrode of the capacitor 13 is the gate electrode 12G of the transistor 12, and the other electrode of the capacitor 13 is the source electrode 12S of the transistor 12. Since the gate insulating film 32 formed between the two electrodes of the capacitor 13 is made of a dielectric material, this capacitor 13 functions as a capacitor in which current data corresponding to the value of an electric current flowing between the source and drain of the transistor 12 is written. That is, the capacitor 13 functions as a parasitic capacitance in the gate-to-source path of the transistor 12 and stores the written current data. The source 10S of the transistor 10 and the gate 12G of the transistor 12 are connected via a plurality of openings 47 formed in the gate insulating film 32. The drain 12D of the transistor 12 is connected to one of the emission voltage scan lines $Z_1, Z_2, \ldots, Z_m$ via a plurality of openings 48 formed in the gate insulating film 32.

To form the transistors 10, 11, and 12, capacitor 13, selection scan lines $X_1, X_2, \ldots, X_m$, emission voltage scan lines $Z_1, Z_2, \ldots, Z_m$, and current lines $Y_1, Y_2, \ldots, Y_n$ a metal film deposited on the transparent substrate 30 is first patterned to form the gate electrodes of the transistors 10, 11, and 12, the selection scan lines $X_1, X_2, \ldots, X_m$, and the emission voltage scan lines $Z_1, Z_2, \ldots, Z_m$ in the same step. Subsequently, a gate insulating film 32 of the transistors 10, 11, and 12 is formed on the entire surface, and a semiconductor layer 33, block insulating film 36, and impurity doped layers 34 and 35 are formed in accordance with their respective shapes. After that, a metal film deposited on top of these components is patterned to form a source electrode 10S and drain electrode 10D of the transistor 10, a source electrode 11S and drain electrode 11D of the transistor 11, a source electrode 12S and drain electrode 12D of the transistor 12, and current lines $Y_1, Y_2, \ldots, Y_n$ in the same step. At the intersections of the current lines $Y_1, Y_2, \ldots, Y_n$ and selection scan lines $X_1, X_2, \ldots, X_m$ and the intersections of the current lines $Y_1, Y_2, \ldots, Y_n$ and emission voltage scan lines $Z_1, Z_2, \ldots, Z_m$, the block insulating film 36 is interposed in addition to the gate insulating film 32. After that, a protective insulating film 39 is formed by patterning. In this embodiment, a channel width W or channel length L of the semiconductor layer 33 of each of the three transistors 10, 11, and 12 is appropriately set in accordance with the transistor characteristics of that transistor.

The protective insulating film 39 is covered with an insulating partition wall 46 made of, e.g., silicon nitride (FIG. 3). The partition wall 46 has openings in positions corresponding to the anode electrodes 41 surrounded by the current lines $Y_1, Y_2, \ldots, Y_n$ parallel in the longitudinal direction, and the selection scan lines $X_1, X_2, \ldots, X_m$ and emission voltage scan lines $Z_1, Z_2, \ldots, Z_m$ parallel in the lateral direction. The organic EL element $E_{i,j}$ is formed in each of regions partitioned in a matrix manner by the partition wall 46, i.e., in each of regions surrounded by the current lines $Y_1, Y_2, \ldots, Y_n$, selection scan lines $X_1, X_2, \ldots, X_m$, and emission voltage scan lines $Z_1, Z_2, \ldots, Z_m$. The partition wall 46 is formed after the formation of the transistors 10, 11, and 12, capacitor 13, selection scan lines $X_1, X_2, \ldots, X_m$, current lines $Y_1, Y_2, \ldots, Y_n$, and emission voltage scan lines $Z_1, Z_2, \ldots, Z_m$.

The organic EL element $E_{i,j}$ will be described next. As shown in FIG. 3, this organic EL element $E_{i,j}$ includes the anode electrode 41, an organic EL layer 42, and a cathode electrode 43. In the organic EL element $E_{i,j}$, the organic EL layer 42 and cathode electrode 43 are stacked in this order from the anode electrode 41. The anode electrode 41 is formed on the gate insulating film 32 in each of the regions surrounded by the current lines $Y_1, Y_2, \ldots, Y_n$ and selection scan lines $X_1, X_2, \ldots, X_m$. This anode electrode 41 preferably injects holes efficiently into the organic EL layer 42. Examples of the main component of the material of this anode electrode 41 are tin-doped indium oxide (ITO), zinc-doped indium oxide (IZO), indium oxide ($In_2O_3$), tin oxide ($SnO_2$), and zinc oxide (ZnO). The anode electrode 41 is formed before the formation of the source electrode 12S of the transistor 12. After this anode electrode 41 is formed, the source electrode 12S of the transistor 12 is formed, and the protective insulating film 39 is formed after that.

The organic EL layer 42 is formed on the anode electrode 41. This organic EL layer 42 can have any of a three-layered structure in which a hole transporting layer, light emitting layer, and electron transporting layer are stacked in this order from the anode electrode 41, a two-layered structure in which a hole transporting layer and light emitting layer are stacked in this order from the anode electrode 41, a single-layered structure having only a light emitting layer, and some other layer arrangement.

The organic EL layer 42 has a function of injecting holes and electrons, a function of transporting holes and electrons, and a function of emitting light by generating excitons by recombination of holes and electrons. This organic EL layer 42 is desirably an electronically neutral organic compound. The organic EL layer 42 like this achieves well-balanced injection and transportation of holes and electrons.

It is possible to appropriately mix an electron transporting material in the light emitting layer, a hole transporting material in the light emitting layer, or both an electron transporting material and hole transporting material in the light emitting layer.

This light emitting layer of the organic EL layer 42 contains a light emitting material. A high-molecular material is used as this light emitting material. Examples of the high-molecular material are polycarbazole-based, polyparaphenylene-based, polyarylenevinylene-based, polythiophene-based, polyfluorene-based, polysilane-based, polyacetylene-based, polyaniline-based, polypyridine-based, polypyridinevinylene-based, and polypyrrol-based materials. Examples of the high-molecular material are a polymer or copolymer of a monomer or oligomer forming the above-mentioned high-molecular material (polymer), a polymer or copolymer of a derivative of the monomer or oligomer, and a polymer or copolymer obtained by polymerizing a monomer having oxazole (oxandiazole, triazole, or diazole) or a triphenylamine skeleton. Monomers of these polymers include monomers and precursor polymers which form the aforementioned compounds when given heat, pressure, UV, or electron beams. It is also possible to introduce a non-conjugate unit which combines these monomers.

Practical examples of these high-molecular material are polyfluorene, polyvinylcarbazole, polytodecylthiophene (?), polyethylenedioxythiophene, a polystyrenesulfonic acid dispersed modified product, poly9,9-dialkylfluorene, poly(thienylene-9,9-dialkylfluorene), poly(2,5-dialkylparaphenylenethienylene), (dialkyl: R=C1 to C20), polyparaphenylenevinylene, poly(2-methoxy-5-(2'-ethyl-hexyloxy)-paraphenylenevinylene), poly(2-methoxy-5-(2'-ethyl-pentyloxy)-paraphenylenevinylene), poly(2,5-dimethyl-paraphenylenevinylene), poly(2,5-thienylenevinylene), poly(2,5-dimethoxyparaphenylenevinylene), and poly(1,4-paraphenylenecyanovinylene).

A film of a low-molecular material, instead of the high-molecular material, can also be formed by evaporation. Depending on the properties of a low-molecular material, the low-molecular material can be dissolved in a solvent and used by coating. Furthermore, a low-molecular material can be dispersed as a dopant in a polymer. When a low-molecular material is thus dispersed in a polymer, it is possible to use various types of polymers including well-known, general-purpose polymers.

Examples of the low-molecular light emitting material (light emitting substance or dopant) are anthracene, naphthalene, phenanthrene, pyrene, tethracene, coronene, chrysene, fluoresceine, perylene, phthaloperylene, naphthaloperylene, perinone, phthaloperinone, naphthaloperinone, diphenylbutadiene, tetraphenylbutadiene, coumarin, oxadiazole, aldazine, bisbenzoquizoline (?), bisstyryl, pyrazine, oxine, aminoquinoline, imine, diphenylethylene, vinylanthracene, diaminocarbazole, pyran, thiopyran, polymethine, merocyanine, an imidazole chelated oxynoid compound, 4-dicyanomethylene-4H-pyran, 4-dicyanomethylene-4H-thiopyran, diketone, a chlorine-based compound, and their derivatives. Practical examples of the low-molecular light emitting material are Alq3 and quinacridone.

The light emitting material is not limited to those enumerated above.

Examples of the electron transporting material contained in the light emitting layer or electron transporting layer are a quinoline derivative, e.g., 8-quinolinol such as tris(8-quinolinolato)aluminum(Alq3) or an organic metal complex having a derivative of this 8-quinolinol as a ligand, an oxadiazole derivative, a perylene derivative, a pyridine derivative, a pyrimidine derivative, a quinoxaline derivative, a diphenylquinone derivative, and a nitro-substituted fluorene derivative.

Examples of the hole transporting material contained in the light emitting layer or hole transporting layer are a tetraarylbenzicine (?) compound (triaryldiamine or triphenyldiamine: TPD), aromatic tertiary amine, a hydrazone derivative, an imidazole derivative, an oxadiazole derivative having an amino group, and polythiophene.

The cathode electrode 43 is formed on the organic EL layer 42. This organic EL layer 42 is so formed as to extend on the partition wall 46, and the cathode electrode 43 is a layer shared by all the organic EL elements $E_{1,1}$ to $E_{m,n}$ formed in the light emitting unit 2. This cathode electrode 43 is made of a material having excellent electron injection properties and a small work function. More specifically, it is preferable to combine at least one metal selected from lithium, indium, magnesium, calcium, barium, and a rare earth element and a low-resistance material such as gold, silver, copper, aluminum, and chromium. More preferably, the low-resistance material is formed on the low-work-function material.

When an electric field is generated between the anode electrode 41 and cathode electrode 43 in the organic EL element $E_{i,j}$ having the stacked structure as described above, holes are injected from the anode electrode 41 into the organic EL layer 42, and electrons are injected from the cathode electrode 43 into the organic EL layer 42. These holes and electrons are transported to the light emitting layer of the organic EL layer 42, and recombine in this light emitting layer to generate excitons, thereby emitting light.

In the light emitting panel 2 described above, a shielding layer 44 such as silicone oil or an organic insulating material which shields water and oxygen is formed on the cathode electrode 43 on the entire panel surface. In addition, a sealing layer 45 made of a transparent material such as silica glass or some other glass or a transparent material such as resin is formed on the shielding layer 44. The shielding layer 44 and sealing layer 45 protect the organic EL elements $E_{i,j}$, pixel driving circuits $D_{i,j}$, selection scan lines $X_1, X_2, \ldots, X_m$, emission voltage scan lines $Z_1, Z_2, \ldots, Z_m$, and current lines $Y_1, Y_2, \ldots, Y_n$.

The circuit configuration of the pixel driving circuit $D_{i,j}$ will be described in detail below. As shown FIGS. 2, 5A, and 5B, the gate electrode 10G of the transistor 10 is connected to the selection scan line $X_i$. The drain electrode 10D of the transistor 10 is connected to the drain electrode 12D of the transistor 12 and to the emission voltage scan line $Z_i$. The source electrode 10S of the transistor 10 is connected to the gate electrode 12G of the transistor 12 and to one terminal of the capacitor 13. The source electrode 12S of the transistor 12 is connected to the other terminal of the capacitor 13 and the drain electrode 11D of the transistor 11, and to the anode electrode 41 of the organic EL element $E_{i,j}$. The gate electrode 11G of the transistor 11 is connected to the selection scan line $X_i$. The source electrode 11S of the transistor 11 is connected to the current line $Y_j$. A reference potential $V_{SS}$ is supplied to the cathode electrode of the organic EL element $E_{i,j}$. A voltage $V_{NSE}$ applied to the emission voltage scan line $Z_i$ during a non-selection period (to be described in detail later) is equal to or higher than the reference potential $V_{SS}$. A voltage $V_{SE}$ applied to the emission voltage scan line $Z_i$ during a selection period (to be described in detail later) is equal to or lower than the reference potential $V_{SS}$. For example, this reference potential $V_{SS}$ is the ground potential.

As shown in FIG. 1, the selection scan driver 3 is connected to the selection scan lines $X_1$ to $X_m$ of the light emitting unit 2. This selection scan driver 3 is a so-called shift register. In accordance with the control signals φs output from the controller 6, the selection scan driver 3 sequentially outputs scan signals to the selection scan lines in turn from the selection scan line $X_1$ to the selection scan line $X_m$ (after this selection scan line $X_m$, to the selection scan line $X_1$), thereby sequentially selecting the transistors 10 and 11 connected to these selection scan lines $X_1$ to $X_m$. More specifically, when the transistors 10 and 11 are n-channel transistors, the selection scan driver 3 selectively applies a selection scan signal at a high-level ON voltage $V_{ON}$ (much higher than the reference potential $V_{SS}$) or low-level OFF voltage $V_{OFF}$ (equal to or lower than the reference potential $V_{SS}$) to the selection scan lines $X_1$ to $X_m$. That is, in a selection period during which one selection scan line $X_i$ of the selection scan lines $X_1$ to $X_m$ is selected, the selection scan driver 3 outputs a pulse of the ON voltage $V_{ON}$ to this selection scan line $X_i$, thereby turning on the transistors 11 and 12 (the transistors 11 and 12 of all of the pixel driving circuits $D_{i,1}$ to $D_{i,n}$) connected to the selection scan line $X_i$. In a non-selection period other than this selection period, the selection scan driver 3 applies the OFF voltage $V_{OFF}$ to the selection scan line $X_i$ to turn off these transistors 11 and 12. Desirably, the selection periods of the selection scan lines $X_1$ to $X_m$ do not overlap each other. However, when a plurality of pixels P connected to the current line $Y_j$ in the same column are to emit the same tone, it is also possible to synchronize selection periods of the selection scan lines $X_1$ to $X_m$ and synchronize selection periods of the emission voltage scan lines $Z_1$ to $Z_m$.

The emission voltage scan driver 4 is connected to the emission voltage scan lines $Z_1$ to $Z_m$ of the light emitting unit 2. This emission voltage scan driver 4 is a so-called shift register. That is, in accordance with the control signals φe output from the controller 6, the emission voltage scan driver 4 sequentially outputs pulse signals to the emission voltage scan lines in turn from the emission voltage scan line $Z_1$ to the emission voltage scan line $Z_m$ (after this emission voltage scan line $Z_m$, to the emission voltage scan line $Z_1$). More specifically, the emission voltage scan driver 4 applies a selection voltage (e.g., 0 [V] if the reference potential is the ground potential) equal to or lower than the reference potential $V_{SS}$ to the emission voltage scan lines $Z_1$ to $Z_m$ at a predetermined cycle. That is, in the selection period during which one selection scan line $X_i$ of the selection scan lines $X_1$ to $X_m$ is selected, the emission voltage scan driver 4 applies a low-level selection voltage to the emission voltage scan line $Z_1$. In the non-selection period, on the other hand, the emission voltage scan driver 4 applies the high-level, non-selection voltage $V_{NSE}$ higher than the reference potential $V_{SS}$ to the emission voltage scan line $Z_i$. This non-selection voltage $V_{NSE}$ can be a negative voltage as long as it is higher than the reference potential $V_{SS}$, but has a sufficiently large value by which a source-drain voltage $V_{DS}$ of the transistor 12 reaches a saturated region. Details of the saturated voltage will be explained later.

In accordance with input image data, the controller 6 outputs the control signals φs, φe, and φd to the selection driver 3, emission scan driver 4, and data driver 5, respectively.

The data driver 5 is a current sink type driver which receives the control signals from the controller 6 and draws, from the current lines $Y_1$ to $Y_n$, memory currents flowing to the data driver 5. That is, this data driver 5 has a current sink circuit and, as indicated by the arrows shown in FIG. 5A, gives rise to memory currents in the current lines $Y_1$ to $Y_n$. The current value of a display current flowing when the organic EL elements $E_{1,1}$ to $E_{m,n}$ emit light in the non-selection period is equal to the current value of the memory current. During the selection period, the data driver 5 stores electric charge, as current data, which has a magnitude corresponding to the current value of this memory current, in each capacitor 13.

The operation principle of the pixels $P_{1,1}$ to $P_{m,n}$ when the data driver 5 supplies storage current having a predetermined current value to the current lines $Y_1$ to $Y_n$ will be explained below.

Figure 6:
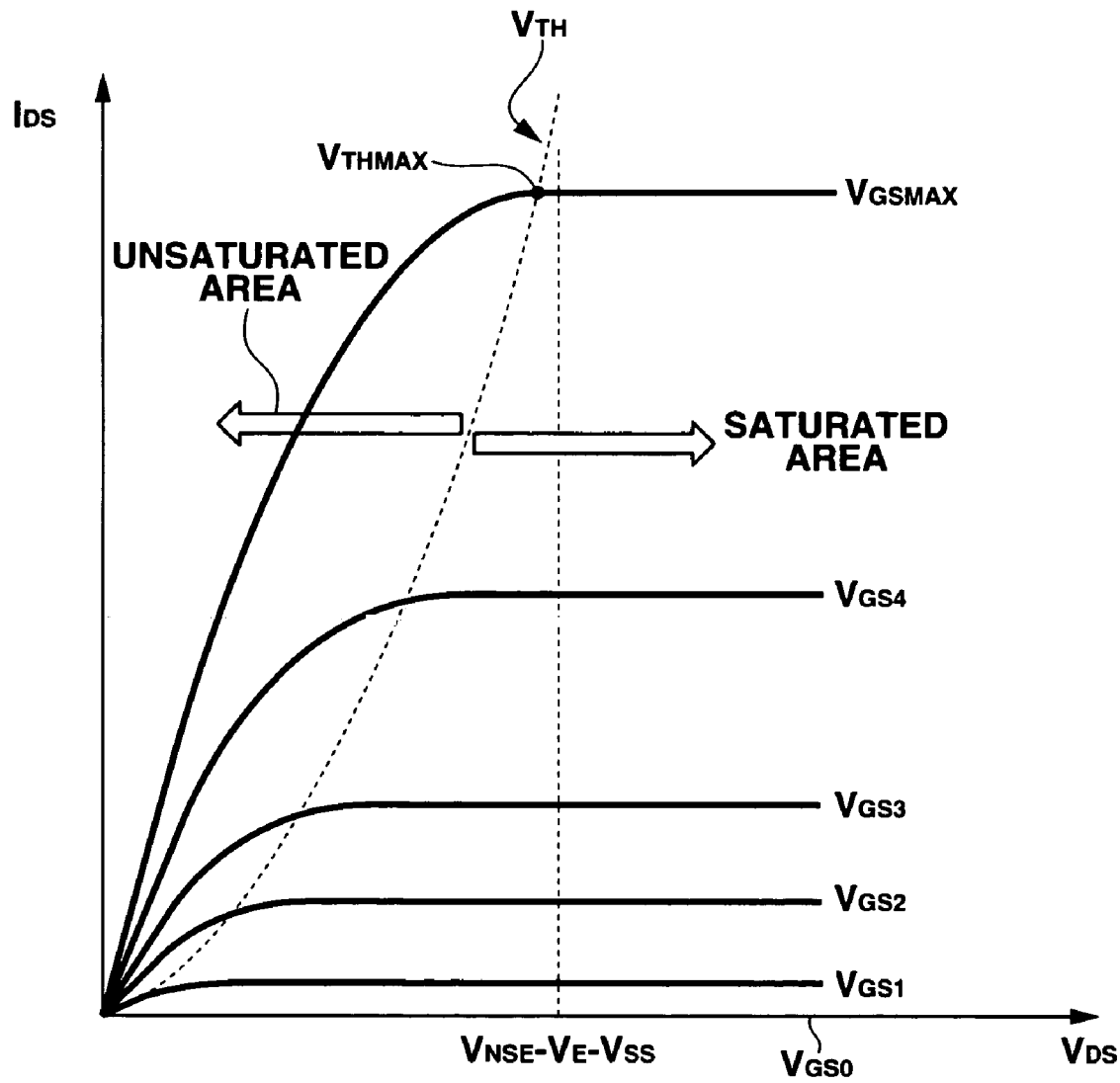
FIG. 6 is a graph showing a relationship between an electric current flowing through an n-channel MOSFET connected in series with a light emitting element of the light emitting element display, and a voltage applied to this MOSFET.

FIG. 6 is a graph showing the current-voltage characteristics of the transistor 12 as an n-channel MOSFET. Referring to FIG. 6, the abscissa indicates the drain-source voltage value, and the ordinate indicates the drain-source current value. In an unsaturated region of this FET, i.e., in a region in which a source-drain voltage value $V_{DS}$ is less than a drain saturated threshold voltage $V_{TH}$ corresponding to a gate-source voltage value $V_{GS}$, if the gate-source voltage value $V_{GS}$ is constant, a source-drain current value $I_{DS}$ increases as the source-drain voltage value $V_{DS}$ increases. In a saturated region in FIG. 6, i.e., in a region in which the source-drain voltage value $V_{DS}$ is equal to or larger than the drain saturated threshold voltage $V_{TH}$ corresponding to the gate-source voltage value $V_{GS}$, if the gate-source voltage value $V_{GS}$ is constant, the source-drain current value $I_{DS}$ is substantially constant.

In the saturated region, the gate-source current value $I_{DS}$ is represented by $$I_{DS} = \frac{\mu C_0 Z}{2L}(V_{GS} - V_{TH})^2 \qquad (1)$$

where μ is the mobility of carriers (electrons), $C_0$ is a capacitance having an MOS structure gate insulating film as a dielectric, Z is a channel width, and L is a channel length.

Referring to FIG. 6, gate-source voltage values $V_{GS0}$ to $V_{GSMAX}$ have a relationship of $V_{GS0}=0<V_{GS1}<V_{GS2}<V_{GS3}<V_{GS4}<V_{GSMAX}$. That is, as is evident from FIG. 6, if the drain-source voltage value $V_{DS}$ is constant, the drain-source current value $I_{DS}$ increases as the gate-source voltage value $V_{GS}$ increases in both the unsaturated and saturated regions. In addition, as the gate-source voltage value $V_{GS}$ increases, the drain saturated threshold voltage $V_{TH}$ increases.

From the foregoing, in the unsaturated region, the source-drain current value $I_{DS}$ changes when the source-drain voltage value $V_{DS}$ slightly changes. In the saturated region, however, the drain-source current value $I_{DS}$ is unconditionally determined if the gate-source voltage value $V_{GS}$ is determined. When the transistor 12 is at the gate-source voltage level $V_{GSMAX}$, the drain-source current level $I_{DS}$ is set at the level of a current flowing between the anode electrode 41 and cathode electrode 43 of the organic EL element $E_{i,j}$ which emits light at the maximum luminance.

Figure 7:
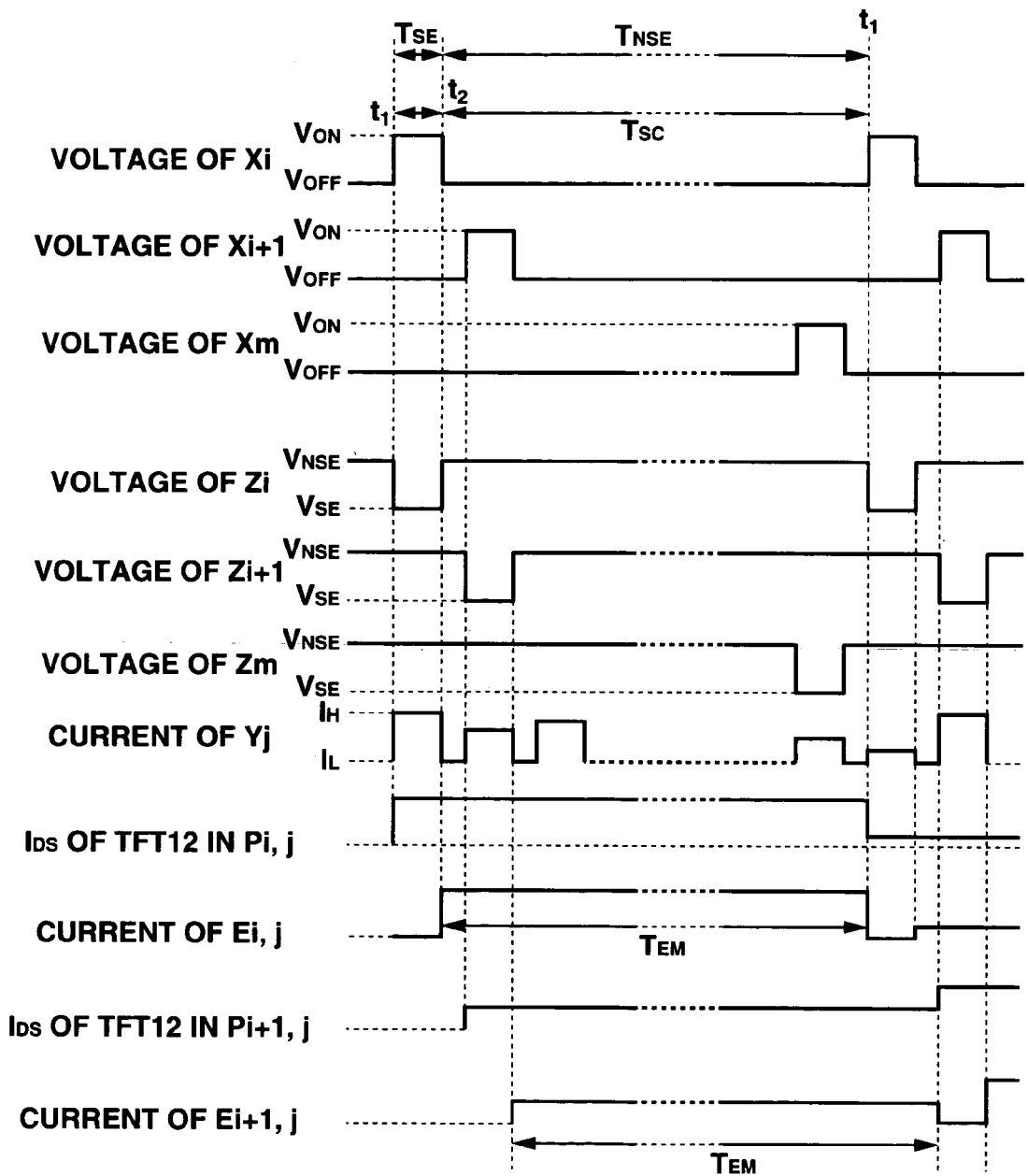
FIG. 7 is a timing chart showing an operation of a driving circuit.

The operation of the pixel driving circuit $D_{i,j}$ configured as above, a method of driving this pixel driving circuit $D_{i,j}$, and the operation of the light emitting element display 1 will be described below with reference to a timing chart shown in FIG. 7. Referring to FIG. 7, a period of $T_{SE}$ is the selection period, a period of $T_{NSE}$ is a non-selection period, and a period of $T_{SC}$ is one scanning period. Note that $T_{SC}=T_{SE}+T_{NSE}$.

In accordance with the control signals φs output from the controller 6, the selection scan driver 3 sequentially outputs high-level (ON-level) pulses to the selection scan lines in turn from the selection scan line $X_1$ in the first row to the selection scan line $X_m$ in the mth row. Also, in accordance with the control signals φe output from the controller 6, the emission voltage scan driver 4 sequentially outputs low-level pulses to the emission voltage scan lines in turn from the emission voltage scan line $Z_1$ in the first row to the emission voltage scan line $Z_m$ in the mth row.

As shown in FIG. 7, in each row the high-level voltage output timing of the selection scan line $X_i$ is substantially the same as the low-level pulse output timing of the emission voltage scan line $Z_i$. The duration of the high-level voltage of the selection scan line $X_i$ is substantially the same as that of the low-level voltage of the emission voltage scan line $Z_i$. A period during which the high-level pulse and low-level pulse are output is the selection period $T_{SE}$ of that row. Also, during this selection period $T_{SE}$ of each row, the data driver 5 generates memory currents (i.e., electric currents flowing toward the data driver 5) in the current lines $Y_1$ to $Y_n$ in all columns in accordance with the control signals φd output from the controller 6. That is, the data driver 5 supplies a memory current to the current line $Y_j$ in each column by a current value corresponding to the image data received by the controller 6.

The flow of an electric current and the application of a voltage to the pixel $P_{i,j}$ will be described in detail below.

At start time $t_1$ of the selection period $T_{SE}$ in the first row, the selection scan driver 3 outputs an ON-level (high-level) voltage to the selection scan line $X_i$ in the ith row. During this selection period $T_{SE}$ from time $t_1$ to time $t_2$, a scan signal voltage $V_{ON}$ at a level by which the transistors 10 and 11 are turned on is applied to the selection scan line $X_i$. Also, in this selection period $T_{SE}$ of the first row, a selection voltage $V_{SE}$ equal to or lower than the reference voltage $V_{SS}$ is applied to the emission voltage scan line $Z_i$. Furthermore, in the selection period $T_{SE}$ the data driver 5 supplies a memory current having a predetermined current value in accordance with the image data received by the controller 6.

In this selection period $T_{SE}$, therefore, the transistor 10 is turned on to allow an electric current to flow from the drain to the source, and a voltage is applied to the gate of the transistor 12 and one terminal of the capacitor 13, thereby turning on the transistor 12. In addition, in the selection period $T_{SE}$, the transistor 11 is turned on, and the data driver 5 supplies memory currents corresponding to the image data to the current lines $Y_1, Y_2, \ldots, Y_j, Y_{j+1}, \ldots, Y_n$. To supply the memory currents to these current lines $Y_1, Y_2, \ldots, Y_j, Y_{j+1}, \ldots, Y_n$, the data driver 5 sets the current lines $Y_1, Y_2, \ldots, Y_j, Y_{j+1}, \ldots, Y_n$ at a voltage equal to or lower than the selection voltage $V_{SE}$ and equal to or lower than the reference voltage $V_{SS}$, thereby making the potential of the source 12S of the transistor 12 lower than that of the drain.

Furthermore, since a potential difference is produced between the gate and source of the transistor 12, memory currents $I_1, I_2, \ldots, I_j, I_{j+1}, \ldots, I_n$ having current values (i.e., current values corresponding to the image data) designated by the data driver 5 flow through the current lines $Y_1, Y_2, \ldots, Y_j, Y_{j+1}, \ldots, Y_n$ in directions indicated by arrows a. In this selection period $T_{SE}$, the selection voltage $V_{SE}$ of the emission voltage scan line $Z_i$ is equal to or lower than the reference voltage $V_{SS}$, and the anode potential of the organic EL element $E_{i,j}$ becomes lower than that of its cathode potential. So, a reverse bias voltage is applied to this organic EL element $E_{i,j}$. Consequently, no electric current from the emission voltage scan line $Z_i$ flows through the organic EL element $E_{i,j}$.

The potential of the other terminal (connected to the source electrode 12S of the transistor 12) of the capacitor 13 of each of the pixels $P_{i,1}$ to $P_{i,n}$ corresponds to the current value (designated) controlled by the data driver 5, and is lower than the gate potential of the transistor 12. That is, electric charge which produces potential differences between the gates and sources of the transistors 12, by which the electric currents $I_1$ to $I_n$ flow through these transistors 12 of the pixels $P_{i,1}$ to $P_{i,n}$, is charged in the capacitors 13 of these pixels $P_{i,1}$ to $P_{i,n}$.

The potential at a given point on, e.g., a line from the transistor 12 to the current line $Y_j$ changes in accordance with, e.g., those internal resistances of the transistors 11 and 12, which change with time. However, an electric current which flows under the current control of the data driver 5 exhibits a predetermined current value. Hence, even when the resistances of the transistors 11 and 12 rise to change the gate-source potential of the transistor 12, the predetermined current value of the electric current flowing in the arrow a direction remains unchanged.

At end time $t_2$ of this selection period $T_{SE}$, the high-level pulse output from the selection scan driver 3 to the selection scan line $X_i$ is terminated, and the low-level pulse output from the emission voltage scan driver 4 to the emission voltage scan line $Z_i$ is terminated. That is, in a non-selection period $T_{NSE}$ from this end time $t_2$ to start time $T_1$ of the next selection period $T_{SE}$, an OFF-level (low-potential) scan signal voltage $V_{OFF}$ is applied to the gates of the transistors 10 and 11 of the selection scan line $X_i$. In addition, a non-selection voltage $V_{NSE}$ much higher than the reference potential $V_{SS}$ is applied to the emission voltage scan line $Z_i$. Accordingly, as shown in FIG. 5B, in this non-selection period $T_{NSE}$ the transistor 11 is turned off and no electric current flows through the current lines $Y_1$ to $Y_n$. Furthermore, the transistor 10 is turned off in the non-selection period $T_{NSE}$.

The organic EL element $E_{i,j}$ inevitably deteriorates with time, i.e., its resistance gradually rises for long time periods, and this gradually raises the divided voltage in this organic EL element $E_{i,j}$. When a constant voltage is applied, therefore, a voltage applied to a transistor connected in series with the organic EL element $E_{i,j}$ may lower relative to the transistor. Letting $V_E$ denote the maximum internal voltage of the organic EL element $E_{i,j}$, which is required to allow this organic EL element $E_{i,j}$ to emit light at the maximum luminance during its emission life period. During the non-selection period $T_{NSE}$ after the selection period $T_{SE}$, as shown in FIG. 6, equation (2) below is met so that the source and drain of the transistor 12 maintain the saturated region, i.e., the source-drain current $I_{DS}$ of the transistor 12 is controlled only by the gate-source voltage $V_{GS}$ of the transistor 12, independently of the source-drain voltage $V_{DS}$ of the transistor 12, even when the gate-source voltage $V_{GS}$ of the transistor 12 is $V_{GSMAX}$ $$V_{NSE} - V_E - V_{SS} \geq V_{THMAX} \quad (2)$$

where $V_{THMAX}$ is a source-drain saturated threshold voltage of the transistor 12 when $V_{GS}$ is $V_{GSMAX}$. This voltage $V_{THMAX}$ is set at a voltage which is expected to be the highest within the range over which the transistor 12 normally operates when $V_{GSMAX}$ is supplied to the gate of this transistor 12, by taking account of this displacement of the saturated threshold value when the transistor 12 deteriorates with time and of variations in the characteristics of a plurality of transistors 12 of the light emitting panel 2.

The two terminals of the capacitor 13 maintain the electric charge charged during the selection period $T_{SE}$, and the transistor 12 keeps being ON. That is, the gate-source voltage value $V_{GS}$ of the transistor 12 in the non-selection period $T_{NSE}$ is equal to that in the selection period $T_{SE}$ before this non-selection period $T_{SE}$. Therefore, the transistor 12 keeps allowing the display current, which is equal to the memory current having the current value corresponding to the image data during the selection period $T_{SE}$, to flow even in the non-selection period $T_{NSE}$. However, the transistor 11 is OFF. As indicated by equation (2) above, therefore, by flowing toward the low reference potential $V_{SS}$ via the organic EL element $E_{i,j}$, a display current flows through the organic EL layer 42 between the anode 41 and cathode 43 of the organic EL element $E_{i,j}$, i.e., the source-drain current $I_{DS}$ of the transistor 12 flows. So, the organic EL element $E_{i,j}$ emits light.

As described above, in the selection period $T_{SE}$, the data driver 5 forcedly supplies the memory current between the source and drain of the transistor 12 through the current line $Y_j$ in accordance with the image data. In the non-selection period $T_{NSE}$, the data driver 5 supplies the display current equal to the extracted memory current to the organic EL element $E_{i,j}$. Accordingly, even when the characteristics of the transistor 12 vary or the characteristics change by deterioration with time, this transistor 12 can supply a desired electric current corresponding to the image data. In addition, a desired electric current flows in the organic EL element $E_{i,j}$ even when the resistance of this organic EL element $E_{i,j}$ rises with time, so stable luminance tone display can be performed. In one pixel, the transistor 12 as a current controlling transistor is the only transistor connected in series with the organic EL element $E_{i,j}$. Therefore, the voltage applied to the emission voltage scan line $Z_i$ is divided only by the organic EL element $E_{i,j}$ and transistor 12. This achieves a low voltage, and as a consequence, low consumption driving. This can also decrease the number of transistors in one pixel to increase the area occupied by an optical element.

When the selection period $T_{SE}$ of the selection scan line $X_i$ is completed, the selection period $T_{SE}$ of the selection scan line $X_{i+1}$ is started subsequently. The selection scan driver 3, emission voltage scan driver 4, data driver 5, and controller 6 operate in the same manner as for the selection scan line $X_i$. In this way, the organic EL elements $E_{1,1}$ to $E_{1,n}$, $E_{2,1}$ to $E_{2,n}$, ..., $E_{m,1}$ to $E_{m,n}$ are linearly selected in turn. After the selection periods of the selection scan lines $X_1$ to $X_m$ are sequentially completed, the selection period $T_{SE}$ of the selection scan line $X_1$ is started again. As described above, an emission time $T_{EM}$ during which each pixel emits light in one scan period $T_{SC}$ is substantially equivalent to the non-selection period $T_{NSE}$. As the number of selection scan lines increases, the emission period $T_{EM}$ can be extended.

Also, the active matrix driving type light emitting element display 1 using current control can be implemented by using the three transistors 10, 11, and 12 for one pixel $P_{i,j}$. This improves the image characteristics of this light emitting element display 1. That is, in the active matrix driving type light emitting element display 1 in which the current values are controlled, the present invention can increase the ratio of the light emission area of the pixel $P_{i,j}$ and hence can increase the other design margin. When the ratio of the light emission area increases, the apparent brightness of the display screen of the light emitting element display 1 can be increased. In addition, when an image is displayed with desired apparent brightness, the value of an electric current which flows per unit area of the organic EL layer 42 can be decreased. This can extend the light emission life of the organic EL element $E_{i,j}$.

Furthermore, a reverse bias voltage is applied to the organic EL element $E_{i,j}$ in the selection period $T_{SE}$, and this extends the life of this organic EL element $E_{i,j}$. In the above embodiment, each of the transistors 10, 11, and 12 of each pixel driving circuit $D_{i,j}$ is a single-channel type FET with only an n-channel in which a semiconductor layer is formed by amorphous silicon. Accordingly, these transistors 10, 11, and 12 can be simultaneously formed on the transparent substrate 30 in the same step. This can suppress an increase in the time or cost for the fabrication of the light emitting panel 2, light emitting element display 1, and pixel driving circuit $D_{i,j}$. The same effects as described in the above embodiment can also be obtained by using p-channel FETs as the transistors 10, 11, and 12. In this case, the individual signals shown in FIG. 7 have opposite phases.

Second Embodiment

Figure 8A:
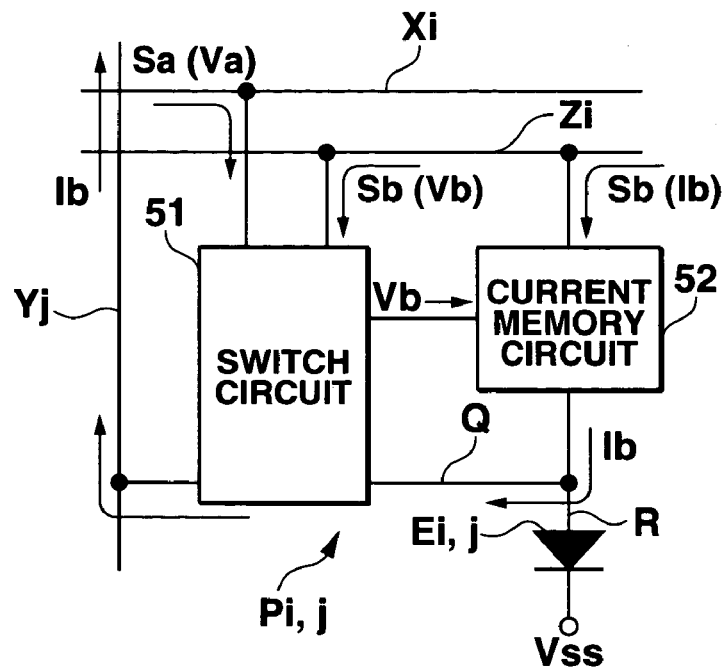
FIG. 8A is an equivalent circuit diagram of a pixel of another light emitting element display, showing the driving principle in a selection period of the pixel of this light emitting element display.
Figure 8B:
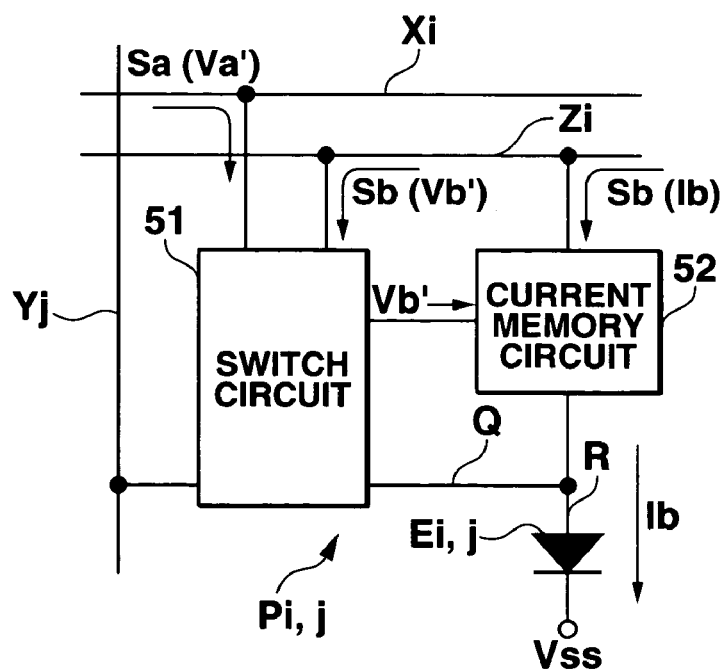
FIG. 8B is an equivalent circuit diagram of the pixel of this light emitting element display, showing the driving principle in a non-selection period.

The second embodiment will be described next. This second embodiment is the same as the first embodiment except for the arrangement of each pixel $P_{i,j}$. That is, in this second embodiment as shown in FIGS. 8A and 8B, each pixel $P_{i,j}$ (a pixel driving circuit $D_{i,j}$ of each pixel $P_{i,j}$) has a switch circuit 51 instead of transistors 10 and 11, and a current memory circuit 52 instead of a transistor 12 and capacitor 13. The same reference numerals as in the above first embodiment denote the same parts, so a detailed explanation thereof will be omitted.

A power supply signal Sb output to an emission voltage scan line $Z_i$ has a voltage value Vb during a selection period $T_{SE}$ and a voltage value Vb' during a non-selection period $T_{NSE}$. These voltage values Vb and Vb' correspond to the non-selection voltage $V_{NSE}$ and reference voltage $V_{SS}$, respectively, shown in FIG. 7.

A scan signal Sa output to a selection scan line $X_i$ has a voltage value Va which turns on the switch circuit 51 during the selection period $T_{SE}$, and a voltage value Va' which turns off the switch circuit 51 during the selection period $T_{SE}$. This scan signal Sa corresponds to the scan signal (scan signal voltage) shown in FIG. 7.

As shown in FIG. 8A, during the selection period $T_{SE}$, the switch circuit 51 outputs the power supply signal Sb from the emission voltage scan line $Z_i$ to the current memory circuit 52 in accordance with the scan signal Sa, and supplies an electric current Ib flowing from the current memory circuit 52 to a current line Y through a line Q. The current value of this electric current Ib is controlled by a current sink type data driver 5 (i.e., this data driver 5 has a current sink) connected to the current line $Y_j$. Also, as shown in FIG. 8B, during the non-selection period $T_{NSE}$, the switch circuit 51 stops the supply of a display current from the current memory circuit 52 to the current line $Y_j$ in accordance with the scan signal Sa, and supplies this display current to an organic EL element $E_{i,j}$ through a line R. Accordingly, this organic EL element $E_{i,j}$ emits light in the non-selection period $T_{NSE}$.

As shown in FIG. 8A, the current memory circuit 52 includes a storage means which, during the selection period $T_{SE}$, allows the electric current Ib controlled by the current sink data driver 5 to flow from the emission voltage scan line $Z_i$ to the line Q in accordance with the signal voltage Vb of the power supply signal Sb from the switch circuit 51, thereby storing the current value of this electric current Ib. As shown in FIG. 8B, during the non-selection period $T_{NSE}$, this current memory circuit 52 allows the electric current Ib corresponding to the current value stored by the storage means to flow from the emission voltage scan line $Z_i$ to the line R in accordance with the signal voltage Vb' from the switch circuit 51. Accordingly, the current value of the electric current Ib during the non-selection period $T_{NSE}$ is equal to or has a linear relationship with the current value of the electric current Ib during the selection period $T_{SE}$.

Third Embodiment

Figure 9A:
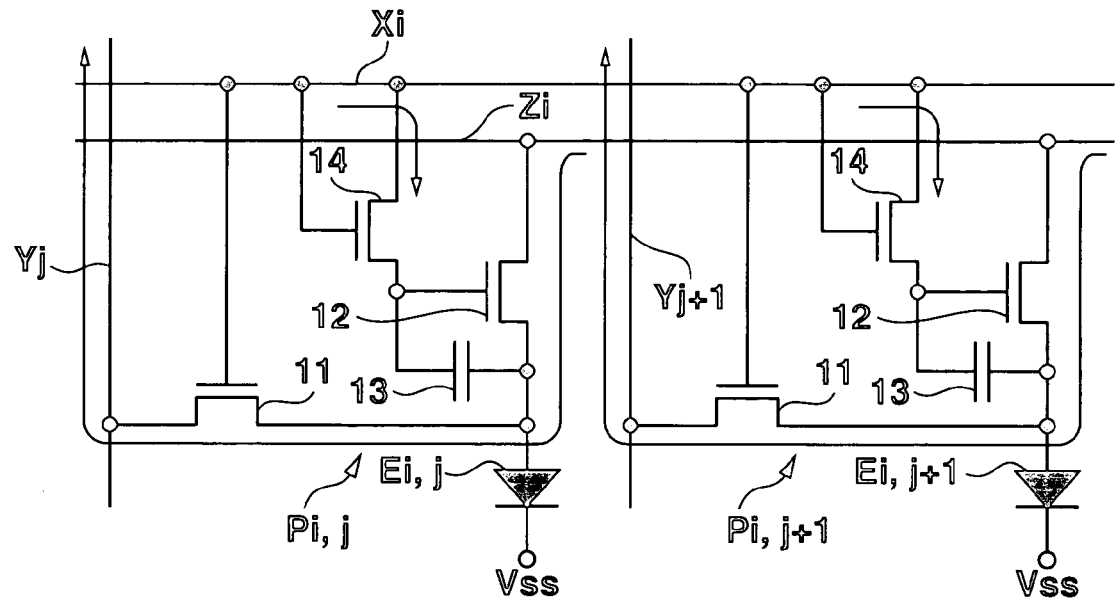
FIG. 9A is an equivalent circuit diagram of a pixel of still another light emitting element display, showing the driving principle in a selection period of the pixel of this light emitting element display.
Figure 9B:
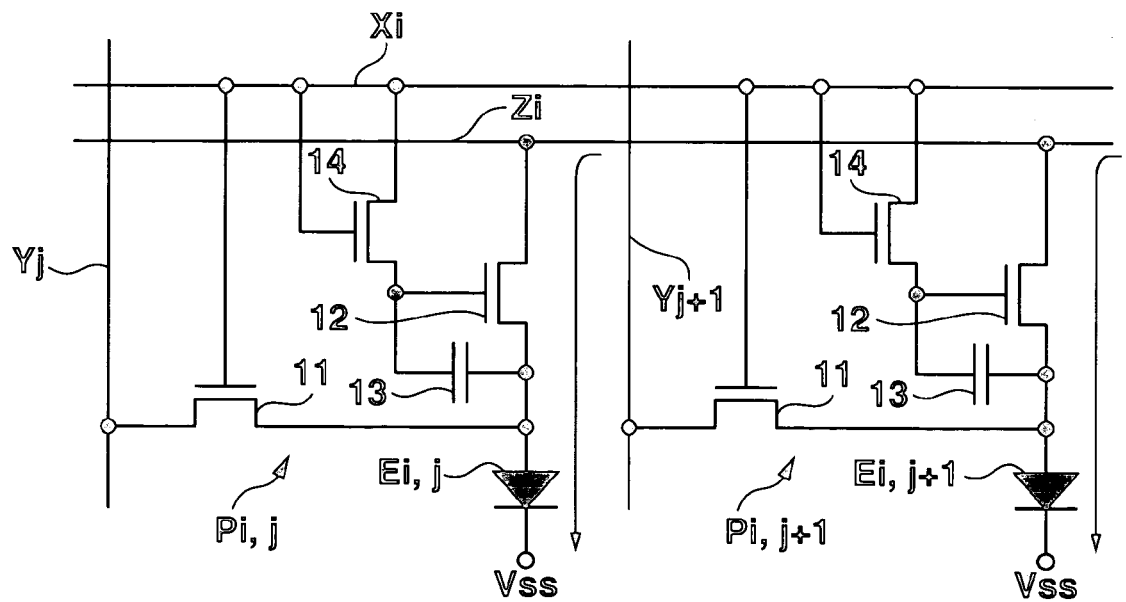
FIG. 9B is an equivalent circuit diagram of the pixel of this light emitting element display, showing the driving principle in a non-selection period.

The third embodiment will be described below. This third embodiment is the same as the first embodiment except for the arrangement of each pixel $P_{i,j}$. That is, as shown in FIGS. 9A and 9B, each pixel $P_{i,j}$ of the third embodiment has a transistor 14 instead of a transistor 10. The same reference numerals as in the above first embodiment denote the same parts, so a detailed explanation thereof will be omitted.

Unlike the transistor 10, a drain electrode 14D and gate electrode 14G of the transistor 14 are connected to a selection scan line $X_i$, and a source electrode 14S of this transistor 14 is connected to a gate electrode 12S of a transistor 12. Similar to a transistor 11 and the transistor 12, the transistor 14 is an n-channel amorphous silicon thin film transistor.

This transistor 14 operates by the application of a voltage such as that shown in the waveform chart shown in FIG. 7. During a selection period $T_{SE}$, the transistor 14 is turned on by an ON-level (high-level) scan signal from the selection scan line $X_i$ to apply a voltage from this selection scan line $X_i$ to the gate of the transistor 12. This transistor 12 is turned on by the gate voltage applied by the transistor 14 in the selection period $T_{SE}$, and supplies an electric current $I_{DS}$ (memory current), which is extracted by a data driver 5 having a current sink, via the transistor 11 which is ON and a current line $Y_j$. In a capacitor 13 connected between the gate and source of the transistor 12, electric charge corresponding to the current value of the electric current which the transistor 12 supplies to the current line $Y_j$ is charged.

During a non-selection period $T_{NSE}$, the transistors 11 and 14 are turned off by an OFF-level scan signal supplied to the selection scan line $X_i$. In the transistor 12, a predetermined voltage is applied between the source and drain by the voltage value corresponding to the electric charge charged in the capacitor 13. Accordingly, this transistor 12 supplies a display current corresponding to the voltage value between the source and drain (i.e., corresponding to the electric charge charged in the capacitor 13) to an organic EL element $E_{i,j}$, thereby causing this organic EL element $E_{i,j}$ to emit light. The electric current flowing in the organic EL element $E_{i,j}$ in this case has a current value corresponding to control signals φs, φd, and φe from a controller 6, i.e., has the current value of the memory current. Therefore, the organic EL element $E_{i,j}$ emits light with luminance corresponding to image data.

Fourth Embodiment

Figure 10A:
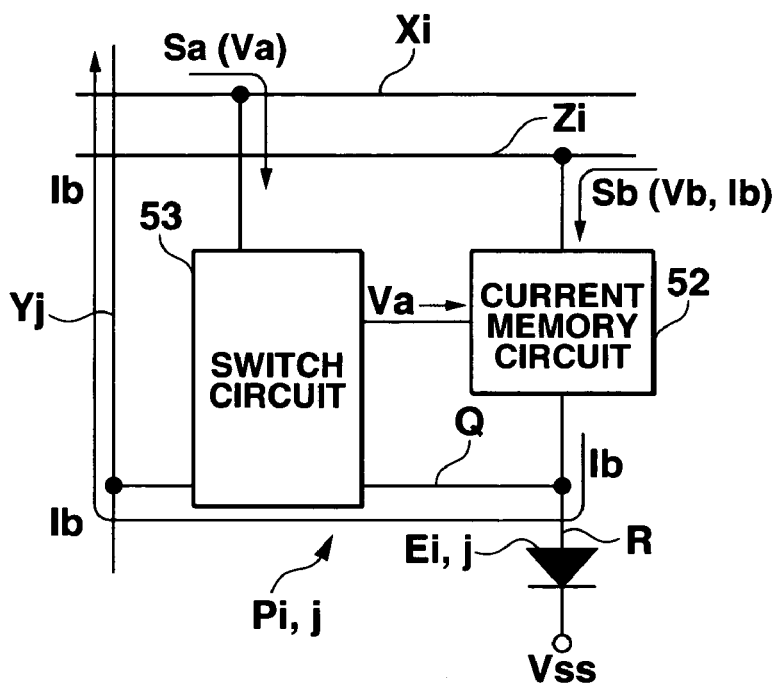
FIG. 10A is an equivalent circuit diagram of a pixel of still another light emitting element display, showing the driving principle in a selection period of the pixel of this light emitting element display.
Figure 10B:
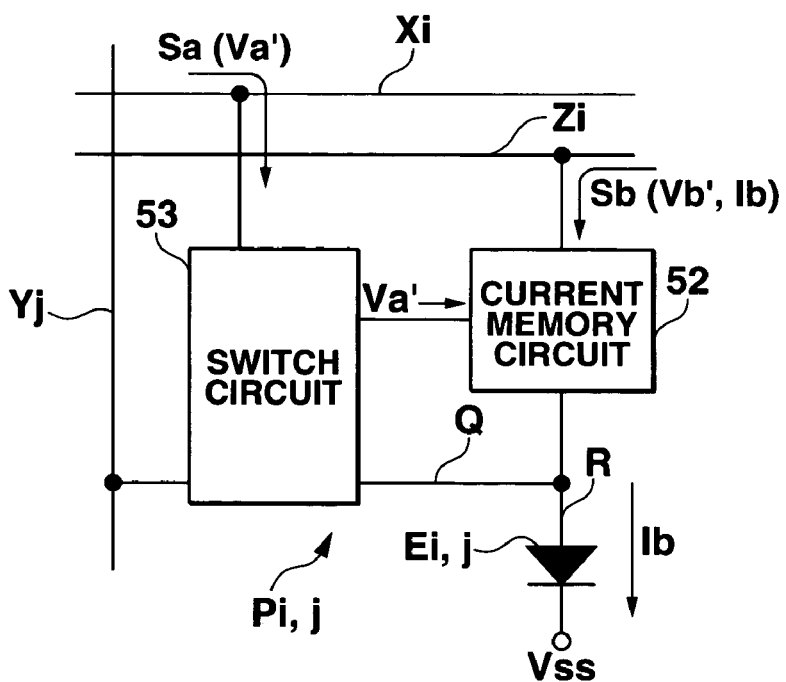
FIG. 10B is an equivalent circuit diagram of the pixel of this light emitting element display, showing the driving principle in a non-selection period.
Figure 11:
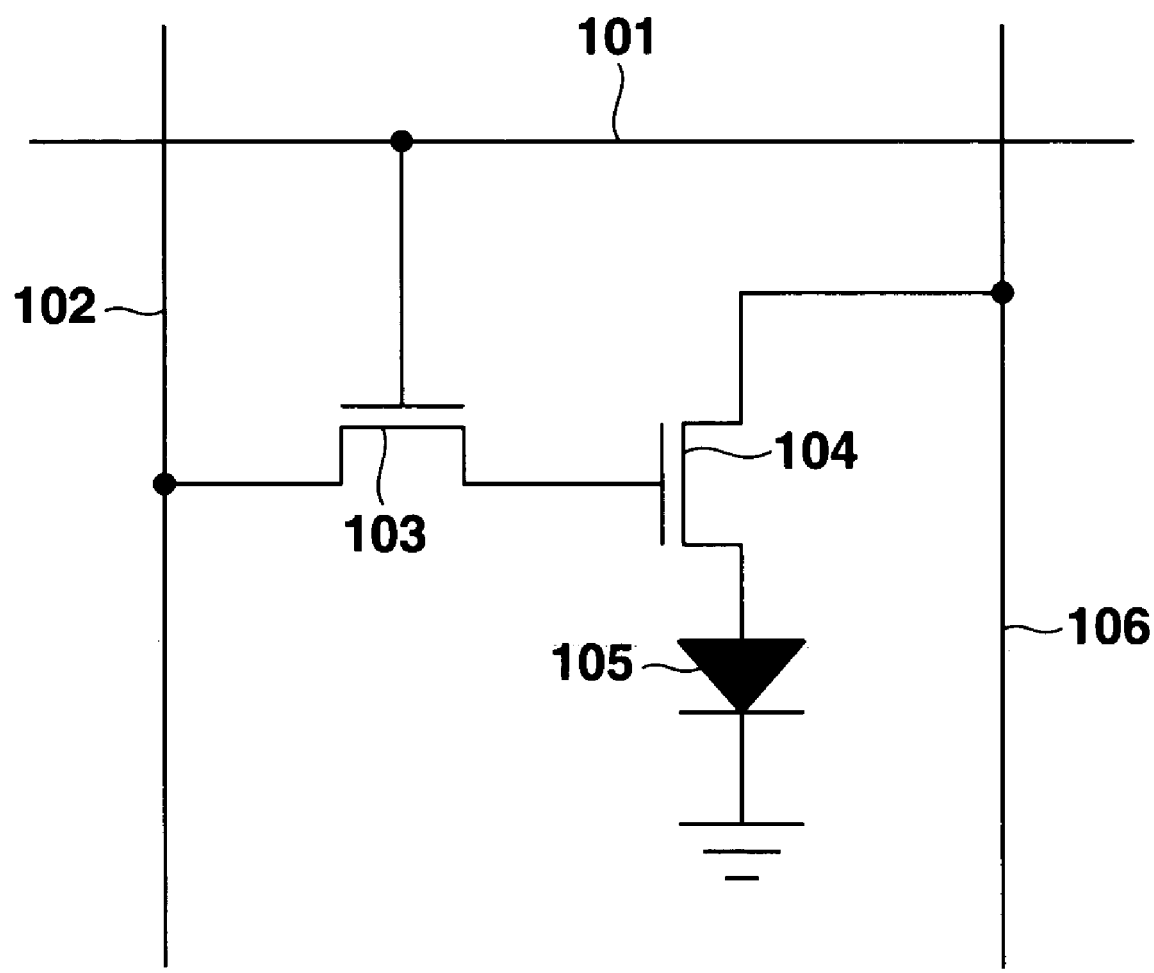
FIG. 11 is an equivalent circuit diagram showing the circuit configuration of one pixel of a conventional light emitting element display.

The fourth embodiment will be described below. This fourth embodiment is the same as the second embodiment except for the arrangement of each pixel $P_{i,j}$. That is, as shown in FIGS. 10A and 10B, each pixel $P_{i,j}$ (a pixel driving circuit $D_{i,j}$ of each pixel $P_{i,j}$) of this fourth embodiment has a switch 53 instead of a switch circuit 51. The same reference numerals as in the above second embodiment denote the same parts, so a detailed explanation thereof will be omitted.

As shown in FIG. 10A, during a selection period $T_{SE}$, the switch 53 outputs an ON-level signal (voltage value Va) to a current memory circuit 52 in accordance with a scan signal Sa, and supplies an electric current Ib flowing from this current memory circuit 52 to a current line $Y_j$ through a line Q. This electric current Ib is controlled by a current sink type data driver 5 (i.e., this data driver 5 has a current sink) connected to the current line $Y_j$. During a non-selection period $T_{NSE}$, the switch 53 stops the supply of the electric current Ib from the current memory circuit 52 to the current line $Y_j$ in accordance with an OFF-level scan signal (voltage value Va'), and supplies a display current to an organic EL element $E_{i,j}$ through a line R. Accordingly, this organic EL element $E_{i,j}$ emits light in the non-selection period $T_{NSE}$.

The present invention is not limited to the above embodiments. That is, various improvements and design changes can be made without departing from the gist of the present invention.

For example, an organic EL element is used as a light emitting element in each of the above embodiments. However, it is also possible to use a light emitting element in which no electric current flows when a reverse bias voltage is applied and an electric current flows when a positive bias voltage is applied, and which emits light with luminance corresponding to the magnitude of the flowing current. An example is an LED (Light Emitting Diode).

Also, the transistors 10, 11, 12, and 14 in the above embodiments are thin film transistors having amorphous silicon as a semiconductor layer (i.e., a channel layer). However, a thin film transistor using a polysilicon semiconductor layer can also be used.

In each of the above embodiments, a capacitor 13 formed by a gate insulating film 32 in which a gate electrode 12G and source electrode 12S are stacked is formed between the gate and source of a transistor 12. However, a capacitor formed by a member not containing at least one of or any of the gate electrode 12G, source electrode 12S, and gate insulating film 32 can also be formed between the gate and source of the transistor 12.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

The invention claimed is:

1. A display panel comprising:
   at least one optical element which has a pair of electrodes and exhibits an optical operation corresponding to an electric current flowing between the pair of electrodes;
   at least one current line;
   at least one switch circuit which supplies a memory current having a predetermined current value to the current line during a selection period, and which stops supply of the current to the current line during a non-selection period; and at least one current memory circuit which stores current data corresponding to the current value of the memory current flowing through the current line during the selection period and, in accordance with the current data stored during the selection period, supplies a display current having a current value substantially equal to the current value of the memory current to the optical element during the non-selection period;

wherein the current memory circuit comprises a current control transistor connected in series with the optical element.

2. A display panel according to claim 1, wherein the current memory circuit comprises a capacitor, in which electric charges are written as the current data, between a gate and a source of the current control transistor.

3. A display panel according to claim 1, wherein the switch circuit comprises a current path control transistor which has a current path having one end connected to the current line, and which supplies the memory current to the current line during the selection period and stops the supply of the memory current to the current line during the non-selection period.

4. A display panel according to claim 1, wherein the switch circuit comprises a current data write control transistor which controls writing of the current data to the current memory circuit.

5. A display panel according to claim 1, wherein the display panel comprises a plurality of said optical elements, a plurality of said current memory circuits, and a plurality of said switch circuits; and wherein a plurality of pixels, each including one said optical element, one said current memory circuit, and one said switch circuit, are arrayed in a matrix.

6. A display panel according to claim 1, further comprising a data driver which allows the memory current to flow from the current memory circuit to the current line during the selection period.

7. A display panel according to claim 1, further comprising a display voltage scan line which is connected to the current memory circuit, and to which a voltage for supplying the display current to the optical element is output.

8. A display panel according to claim 7, wherein a first end of a current path of the current memory circuit is connected to the optical element, and a second end of the current path is connected to the display voltage scan line.

9. A display panel according to claim 1, further comprising a selection scan line to which a selection scan signal for selecting the switch circuit is output.

10. A display panel according to claim 9, wherein the switch circuit comprises a current path control transistor which has a current path having a first end connected to the current line and a second end connected to the current memory circuit, and the current path control transistor of the switch circuit has a control terminal connected to the selection scan line.

11. A display panel according to claim 9, wherein the switch circuit comprises a current data write control transistor having a control terminal connected to the selection scan line.

12. A display panel according to claim 9, further comprising a selection scan driver which outputs the selection scan signal to the selection scan line.

13. A display panel according to claim 1, wherein a first one of the pair of electrodes of the optical element is connected to the current memory circuit, and a second one of the pair of electrodes of the optical element is connected to a constant-voltage power supply.

14. A display panel according to claim 1, wherein the optical element comprises a light emitting element.

15. A display panel according to claim 14, wherein the light emitting element comprises an EL element.

16. A display panel comprising:

at least one optical element which has a pair of electrodes and exhibits an optical operation corresponding to an electric current flowing between the pair of electrodes;

at least one current line;

at least one switch circuit which supplies a memory current having a predetermined current value to the current line during a selection period, and which stops supply of the current to the current line during a non-selection period; and at least one current memory circuit which stores current data corresponding to the current value of the memory current flowing through the current line during the selection period and, in accordance with the current data stored during the selection period, supplies a display current having a current value substantially equal to the current value of the memory current to the optical element during the non-selection period;

wherein the current memory circuit comprises a current control transistor connected in series with the optical element, and wherein the switch circuit comprises a current path control transistor which supplies the memory current to the current line during the selection period, and a current data write control transistor which writes the current value of the memory current flowing through the current line during the selection period as the current data between the gate and source of the current control transistor.

17. A display panel comprising:

at least one optical element which has a pair of electrodes and exhibits an optical operation corresponding to an electric current flowing between the pair of electrodes;

at least one current line;

at least one switch circuit which supplies a memory current having a predetermined current value to the current line during a selection period, and which stops supply of the current to the current line during a non-selection period;

at least one current memory circuit which stores current data corresponding to the current value of the memory current flowing through the current line during the selection period and, in accordance with the current data stored during the selection period, supplies a display current having a current value substantially equal to the current value of the memory current to the optical element during the non-selection period; and a display voltage scan line which is connected to the current memory circuit, and to which a voltage for supplying the display current to the optical element is output;

wherein a first end of a current path of the current memory circuit is connected to the optical element, and a second end of the current path is connected to the display voltage scan line; and wherein the display panel further comprises a display voltage scan driver which applies a voltage to the current memory circuit through the display voltage scan line during the selection period so that the memory current may flow in the current memory circuit during the selection period, and which applies a voltage to the current memory circuit through the display voltage scan line during the non-selection period so that the display current in accordance with the current data may flow in the current memory circuit during the non-selection period, wherein the current value of the display current is substantially equal to the current value of the memory current flowing in the current memory circuit during the selection period.

18. A display panel according to claim 17, wherein a first one of the pair of electrodes of the optical element is connected to the current memory circuit, and a second one of the pair of electrodes of the optical element is connected to a constant-voltage power supply; and wherein the voltage output by the display voltage scan driver during the selection period is not more than a potential of the constant-voltage power supply, and the voltage output by the display voltage scan driver during the non-selection period is not less than the voltage output during the selection period and higher than the potential of the constant-voltage power supply.

19. A display panel comprising:

at least one optical element which has a pair of electrodes and exhibits an optical operation corresponding to an electric current flowing between the pair of electrodes;

at least one current line;

at least one switch circuit which supplies a memory current having a predetermined current value to the current line during a selection period, and which stops supply of the current to the current line during a non-selection period;

at least one current memory circuit which stores current data corresponding to the current value of the memory current flowing through the current line during the selection period and, in accordance with the current data stored during the selection period, supplies a display current having a current value substantially equal to the current value of the memory current to the optical element during the non-selection period;

a display voltage scan line to which a voltage for supplying the display current to the optical element is output; and a selection scan line to which a selection scan signal for selecting the switch circuit is output, wherein the current memory circuit comprises a current control transistor which has a current path having a first end connected to the optical element and a second end connected to the display voltage scan line, and wherein the switch circuit comprises:

a current data write control transistor which has a control terminal connected to the selection scan line, and a current path having a first end connected to the control terminal of the current control transistor and a second end connected to one of the display voltage scan line and the selection scan line; and a current path control transistor which has a control terminal connected to the selection scan line, and a current path having a first end connected to the current line and a second end connected to the first end of the current control transistor.

20. A display panel according to claim 19, further comprising:

a selection scan driver which outputs the selection scan signal to the selection scan line;

a data driver which supplies the memory current to the current line and the current memory circuit during the selection period; and a display voltage scan driver which applies a voltage to the current memory circuit through the display voltage scan line during the selection period so that the memory current may flow in the current memory circuit during the selection period, and applies the voltage to the current memory circuit through the display voltage scan line during the non-selection period so that the display current in accordance with the current data may flow in the current memory circuit during the non-selection period, wherein the current value of the display current is substantially equal to the current value of the memory current flowing in the current memory circuit during the selection period.

21. A display panel according to the claim 19, wherein the display voltage scan driver outputs a saturated current path voltage to the display voltage scan line so that a voltage between the first end and the second end of the current path of the current control transistor may be saturated and the display current in accordance with a voltage between the control terminal and the first end of the current path of the current control transistor may flow through the current path of the current control transistor during the non-selection period.

22. A display panel according to claim 19, wherein the current control transistor, the current data write control transistor, and the current path control transistor are single-channel transistors having the same channel.

23. A display panel driving method for driving a display panel, comprising:

supplying a memory current having a predetermined current value to a current memory circuit of the display panel and storing current data corresponding to the current value to the current memory circuit during a selection period; and supplying, to an optical element of the display panel during a non-selection period, a display current having a current value substantially equal to the current value of the memory current in accordance with the current data stored in the current memory circuit;

wherein the memory current supplied to the current memory circuit is not supplied not through the optical element.

24. A display panel driving method according to claim 23, wherein the memory current is supplied to the current memory circuit through a current line, and the display current supplied to the optical element is not supplied through the current line.

25. A display panel driving method for driving a display panel, comprising:

supplying a memory current having a predetermined current value to a current memory circuit of the display panel and storing current data corresponding to the current value to the current memory circuit during a selection period; and supplying, to an optical element of the display panel during a non-selection period, a display current having a current value substantially equal to the current value of the memory current in accordance with the current data stored in the current memory circuit;

wherein the current memory circuit comprises: (i) a current control transistor which has a current path having a first end connected to a first end of the optical element and a second end connected to a display voltage scan line, and (ii) a capacitor which is connected between a gate and a source of the current control transistor and which stores the current data.

26. A display panel driving method according to claim 25, wherein a voltage for supplying the memory current is output to the display voltage scan line during the selection period, and a voltage for supplying the display current is output to the display voltage scan line during the non-selection period.

27. A display panel driving method according to claim 25, wherein electric charge corresponding to the memory current flowing through the current path of the current control transistor during the selection period is written as the current data in the capacitor under the control of a current data write control transistor in accordance with a selection scan signal from a selection scan line.

28. A display panel driving method according to claim 27, wherein the electric charge written in the capacitor during the selection period is held under the control of the current data write control transistor during the non-selection period.

29. A display panel driving method according to claim 25, wherein the memory current flowing through the current path of the current control transistor during the selection period flows through a current line under the control of a current path control transistor driven in accordance with a selection scan signal from a selection scan line.

30. A display panel driving method according to claim 25, wherein the display current flowing through the current path of the current control transistor during the non-selection period flows through the optical element under the control of a current path control transistor driven in accordance with a selection scan signal from a selection scan line.

31. A display panel driving method according to claim 25, wherein the display panel further comprises:
   a selection scan line to which a selection scan signal is output;
   a current line through which the memory current flows;
   a current data write control transistor which has a control terminal connected to the selection scan line, and a current path having a first end connected to a gate of the current control transistor and a second end connected to one of the display voltage scan line and the selection scan line, and which controls writing of the current data of the memory current in accordance with the selection scan signal; and
   a current path control transistor which has a control terminal connected to the selection scan line, and a current path having a first end connected to the current line and a second end connected to the first end of the current path of the current control transistor, and which supplies the memory current to the current line via the current control transistor in accordance with the selection scan signal.

32. A display panel driving method according to claim 31, wherein the supplying of the memory current and storing the current data corresponding to the current value of the memory current comprises, during the selection period, supplying the memory current to the current path of the current control transistor by selecting the current data write control transistor and the current path control transistor in accordance with the selection scan signal from the selection scan line, and storing electric charge as the current data corresponding to the current value of the memory current in the capacitor, and
   wherein the supplying of the display current to the optical element comprises, during the non-selection period, causing the current data write control transistor to hold the current data and causing the current path control transistor to stop supply of an electric current to the current line in accordance with the selection scan signal from the selection scan line, and applying a voltage different from a potential at a second end of the optical element to the display voltage scan line, whereby the display current corresponding to the current data flows through the path of the current control transistor and the optical element.

33. A display panel driving method according to claim 31, wherein the display panel further comprises:
   a selection scan driver which outputs the selection scan signal to the selection scan line;
   a data driver which draws the memory current from current control transistor to the current line during the selection period; and
   a display voltage scan driver which applies a voltage to the current memory circuit through the display voltage scan line during the selection period so that the memory current may flow in the current control transistor during the selection period, and which applies the voltage to the current control transistor through the display voltage scan line during the non-selection period so that the display current in accordance with the current data may flow in the optical element during the non-selection period.

34. A display panel driving method according to the claim 33, wherein the display voltage scan driver outputs a saturated current path voltage to the display voltage scan line so that a voltage between the first end and the second end of the current path of the current control transistor may be saturated and the display current in accordance with a voltage between the gate and the first end of the current path of the current control transistor may flow through the current path of the current control transistor during the non-selection period.

* * * * *